(12) United States Patent
Hasegawa et al.

(10) Patent No.: US 11,495,696 B2
(45) Date of Patent: Nov. 8, 2022

(54) PHOTOELECTRIC CONVERSION ELEMENT AND SOLID-STATE IMAGING DEVICE

(71) Applicant: SONY SEMICONDUCTOR SOLUTIONS CORPORATION, Kanagawa (JP)

(72) Inventors: Yuta Hasegawa, Kanagawa (JP); Hideaki Mogi, Kanagawa (JP); Takuya Ito, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 255 days.

(21) Appl. No.: 15/770,976

(22) PCT Filed: Sep. 26, 2016

(86) PCT No.: PCT/JP2016/078208
§ 371 (c)(1),
(2) Date: Apr. 25, 2018

(87) PCT Pub. No.: WO2017/077790
PCT Pub. Date: May 11, 2017

(65) Prior Publication Data
US 2018/0342627 A1    Nov. 29, 2018

(30) Foreign Application Priority Data

Nov. 2, 2015  (JP) .............................. JP2015-215966

(51) Int. Cl.
*H01L 31/02*    (2006.01)
*H01L 27/146*   (2006.01)
(Continued)

(52) U.S. Cl.
CPC .............. *H01L 31/02* (2013.01); *C09B 15/00* (2013.01); *C09B 47/04* (2013.01); *C09B 48/00* (2013.01);
(Continued)

(58) Field of Classification Search
None
See application file for complete search history.

(56) References Cited

U.S. PATENT DOCUMENTS

| 5,350,459 A | 9/1994 | Suzuki |
| 5,725,651 A * | 3/1998 | Zambounis .......... C07D 471/04 |
| | | 106/497 |

(Continued)

FOREIGN PATENT DOCUMENTS

| CN | 1272868 A | 11/2000 |
| JP | HEI 05-308146 | 11/1993 |

(Continued)

OTHER PUBLICATIONS

Morse, Boron Subphthalocyanines as Organic Electronic Materials, ACS Appl. Mater. Interfaces, 2012, 4, 5055-5068 (Year: 2012).*

(Continued)

*Primary Examiner* — Shannon M Gardner
(74) *Attorney, Agent, or Firm* — Sheridan Ross P.C.

(57) ABSTRACT

A photoelectric conversion element according to an embodiment of the present disclosure includes: a first electrode 15a and a second electrode 18 facing each other; and a photoelectric conversion layer 17 provided between the first electrode 15a and the second electrode 18, and including a first quinacridone derivative represented by a formula (1).

(Continued)

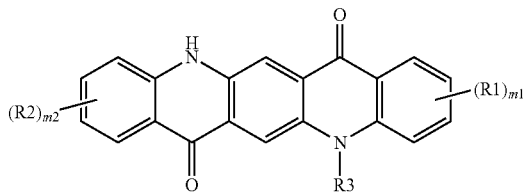

(1)

13 Claims, 12 Drawing Sheets

(51) Int. Cl.
    *C09B 48/00* (2006.01)
    *H01L 51/00* (2006.01)
    *H01L 27/30* (2006.01)
    *C09B 47/04* (2006.01)
    *C09B 15/00* (2006.01)
(52) U.S. Cl.
    CPC ........ *H01L 27/146* (2013.01); *H01L 27/1461* (2013.01); *H01L 27/14636* (2013.01); *H01L 27/14645* (2013.01); *H01L 27/14667* (2013.01); *H01L 51/00* (2013.01); *H01L 51/0072* (2013.01); *H01L 27/307* (2013.01); *Y02E 10/549* (2013.01)

(56) References Cited

U.S. PATENT DOCUMENTS

| 2005/0140284 | A1 | 6/2005 | Im |
| 2013/0112947 | A1 | 5/2013 | Lee et al. |
| 2014/0097416 | A1 | 4/2014 | Lee |
| 2015/0311445 | A1* | 10/2015 | Udaka ................. H01L 51/0068 257/40 |

FOREIGN PATENT DOCUMENTS

| JP | 2003-234460 | 8/2003 |
| JP | 2005-303266 | 10/2005 |
| JP | 2007-234651 | 9/2007 |
| WO | WO-2014073446 A1 * | 5/2014 ......... H01L 51/0068 |
| WO | WO-2015079660 A1 | 6/2015 |

OTHER PUBLICATIONS

Lee,Kwang-Hee et al.,Dynamic Characterization of Green-Sensitive Organic Photodetectors Using Nonfullerene Small Molecules: Frequency Response Based on the Molecular Structure, The Journal of Physical Chemistry C, 2014, vol. 118, p. 13424-13431, DOI: 10.1021/jp5028788.

International Search Report prepared by the Japan Patent Office dated Oct. 12, 2016, for International Application No. PCT/JP2016/078208.

Official Action (with English translation) for Japanese Patent Application No. 2017-548672, dated Sep. 8, 2020, 5 pages.

* cited by examiner

[FIG. 1]
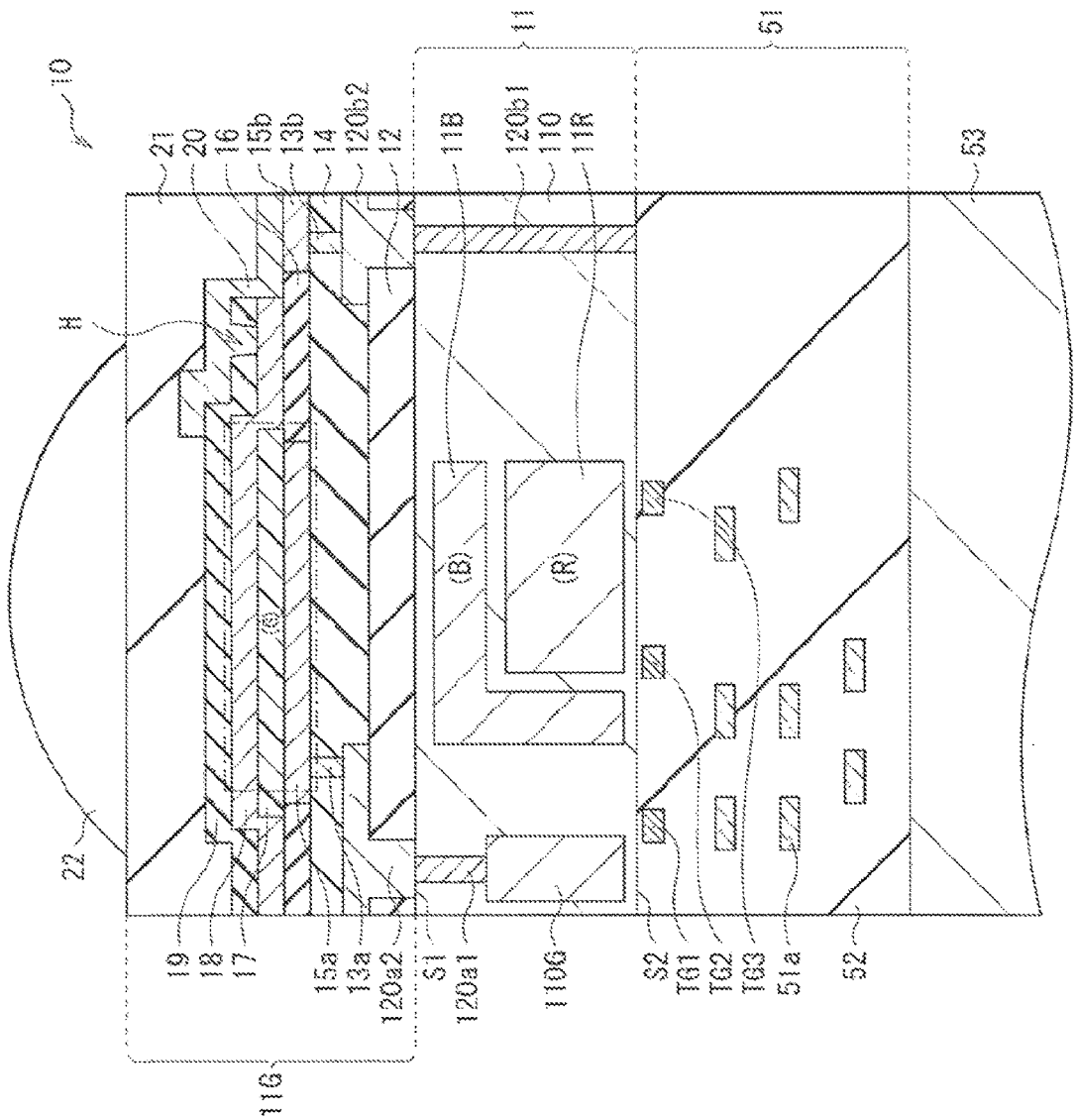

[ FIG. 2 ]
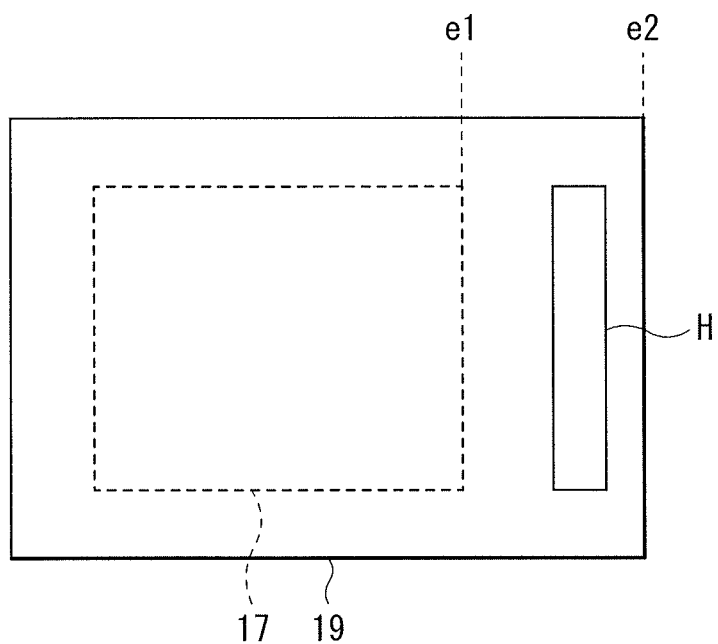

[ FIG. 3A ]
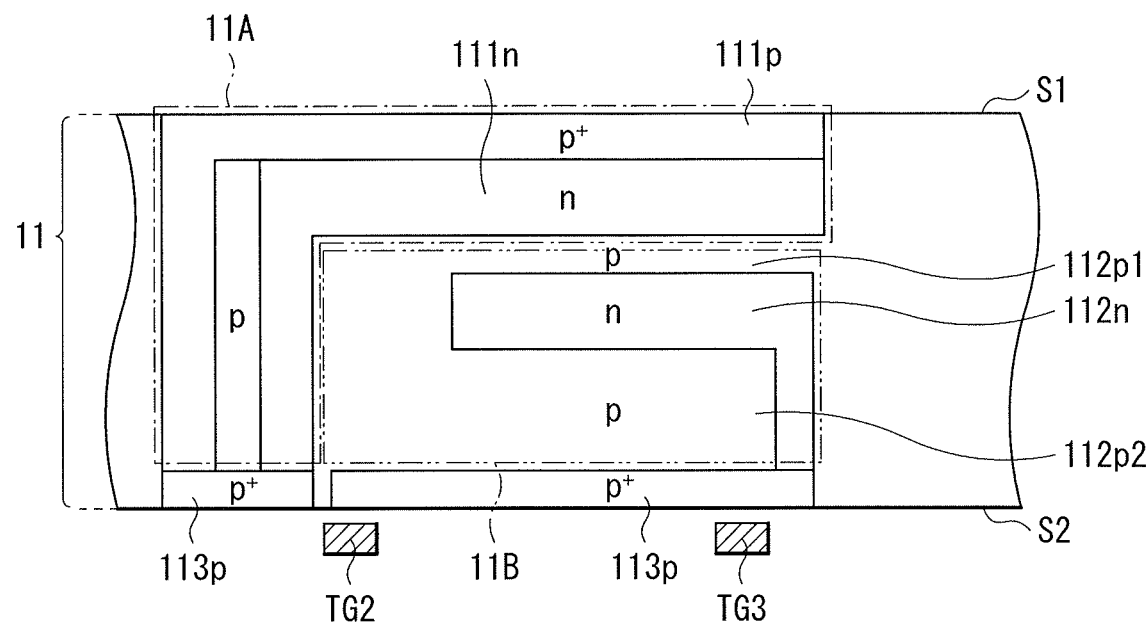
[ FIG. 3B ]
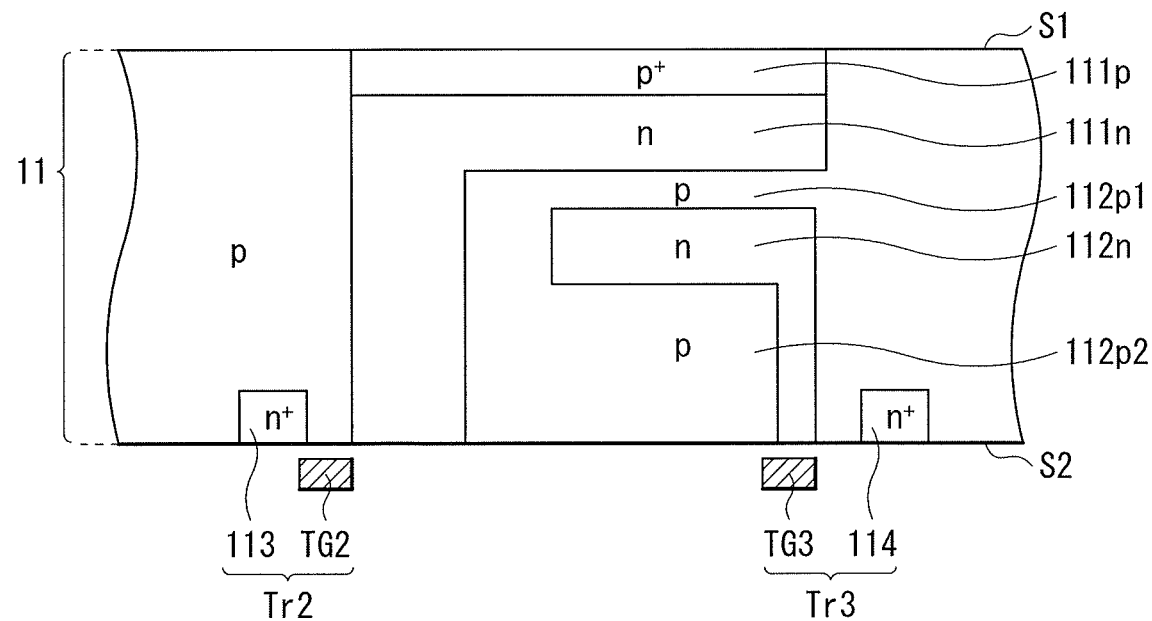

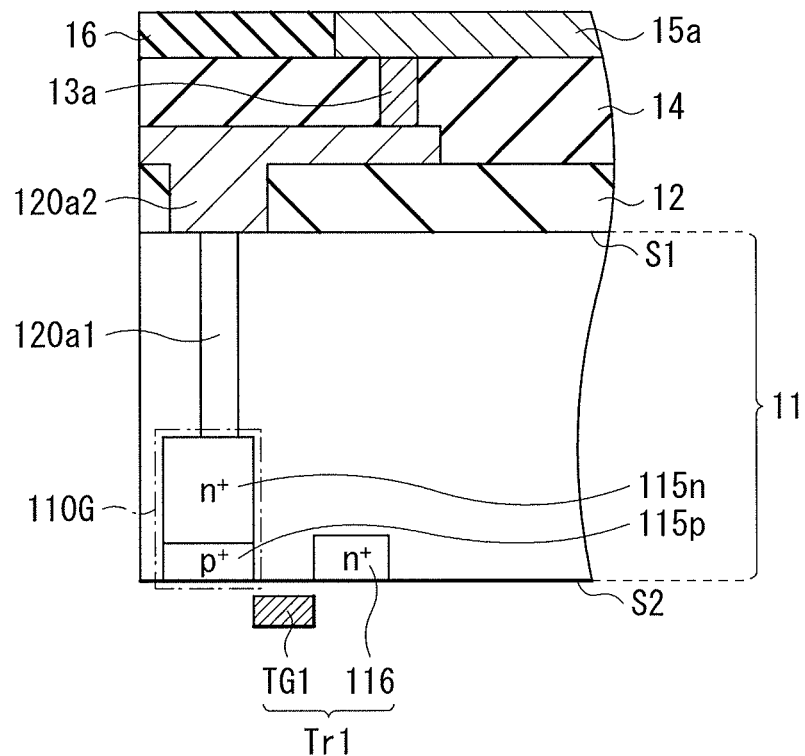
[FIG. 4]

[ FIG. 5A ]
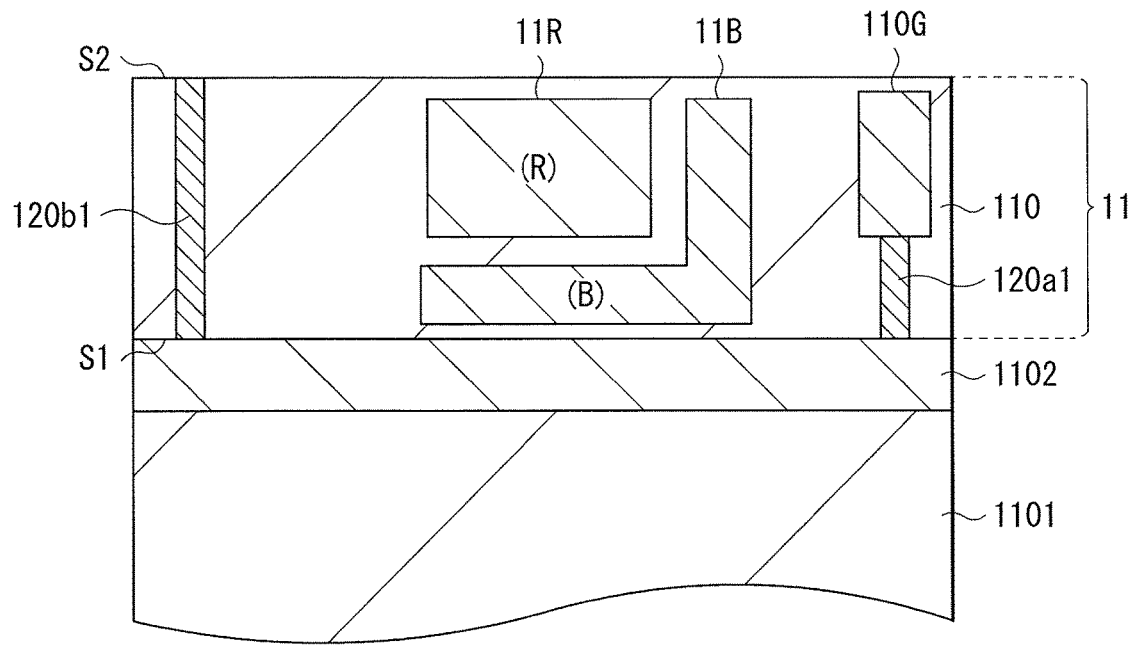
[ FIG. 5B ]
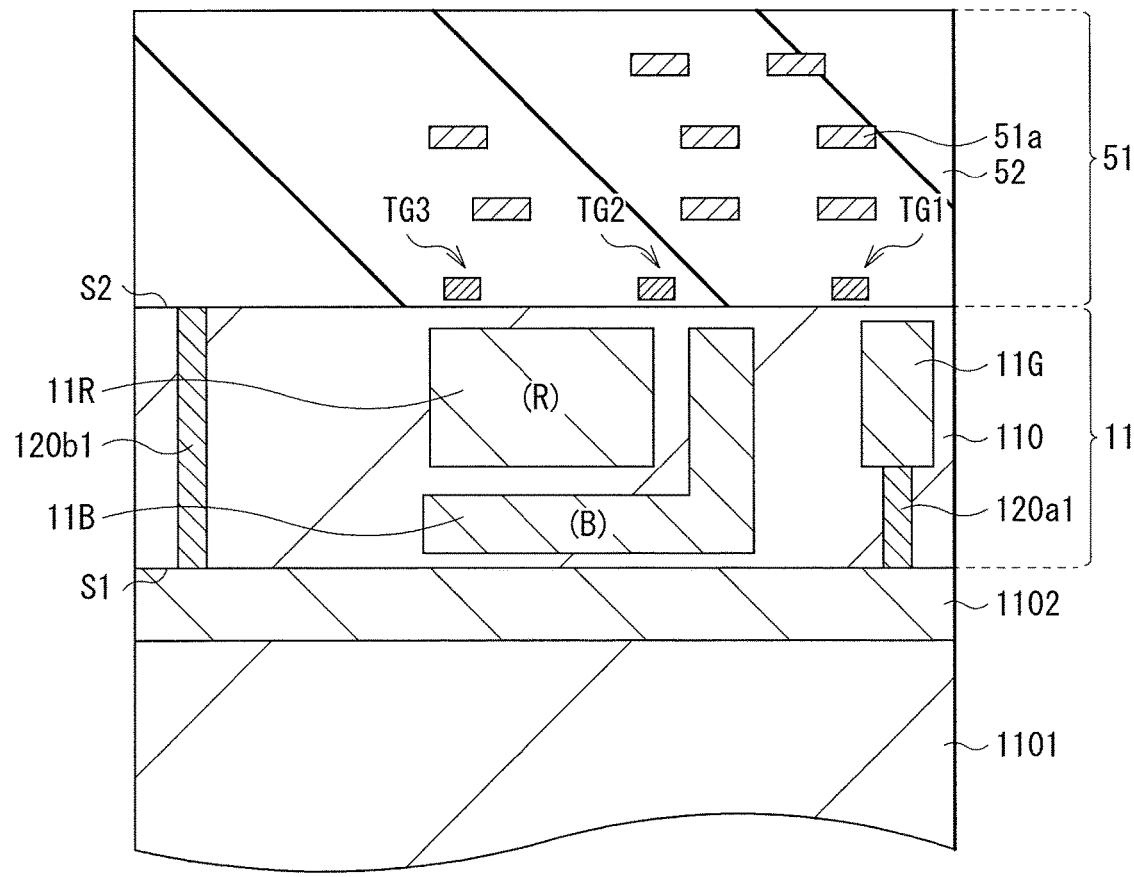

[ FIG. 6A ]
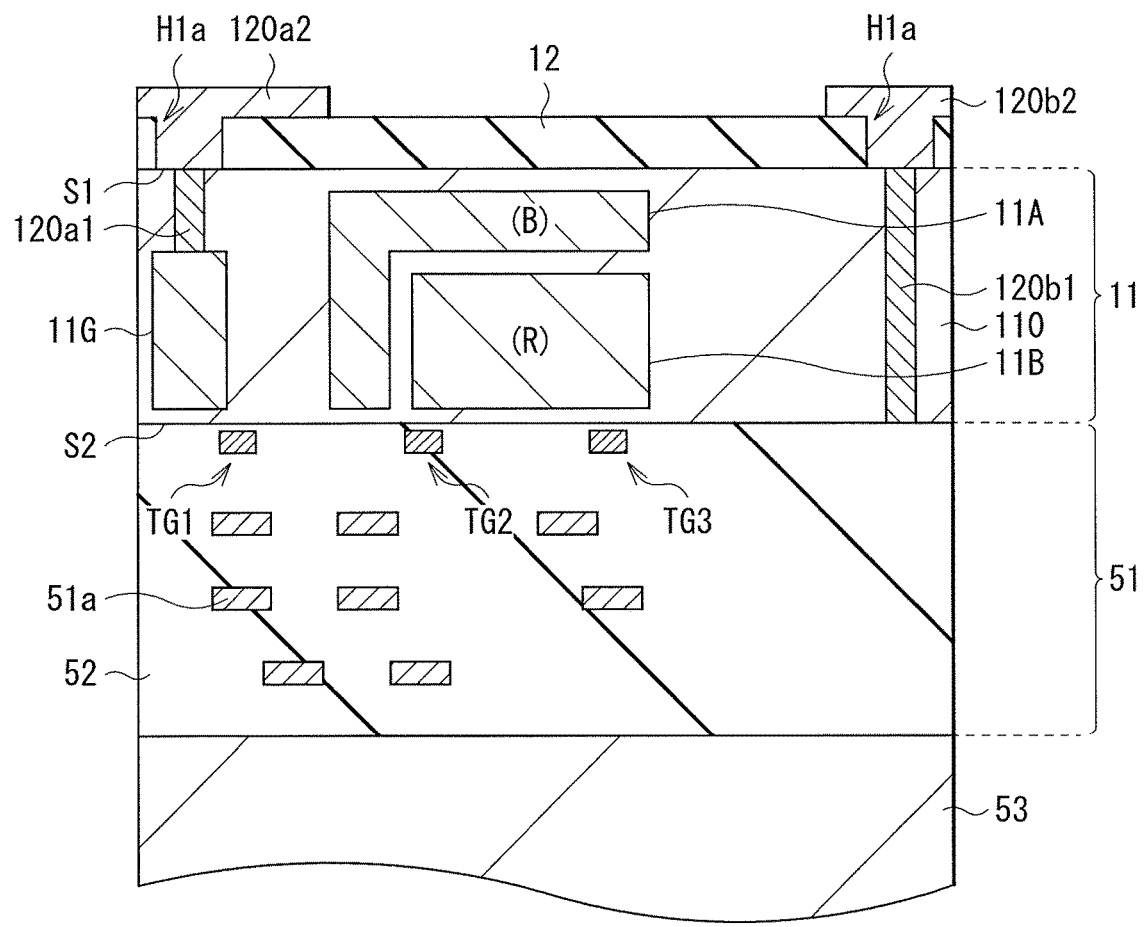

[FIG. 6B]
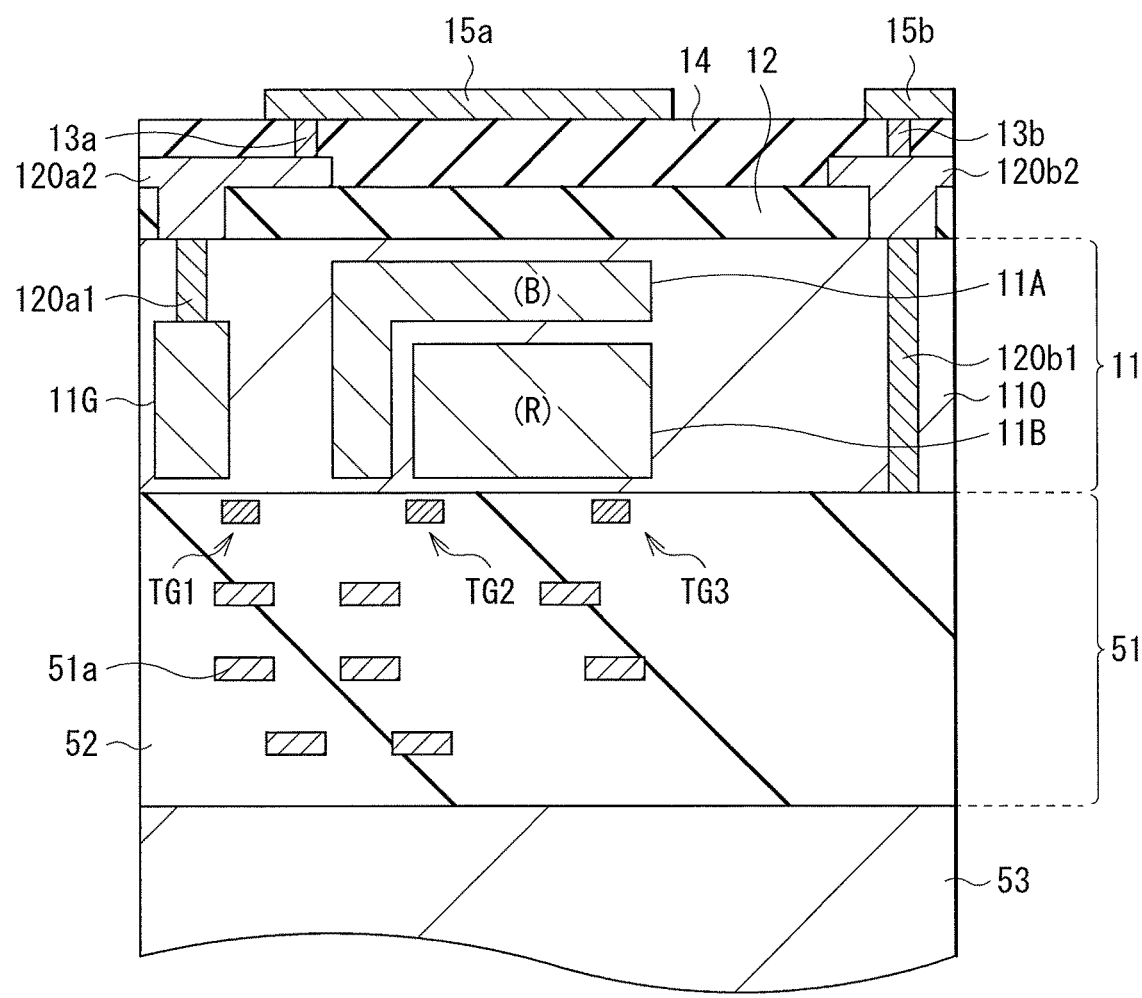

[FIG. 7A]
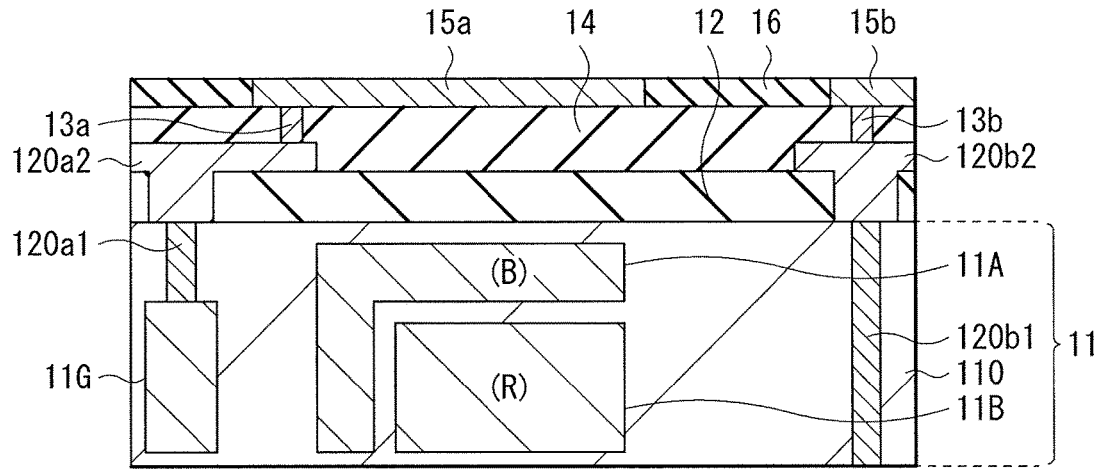
[FIG. 7B]
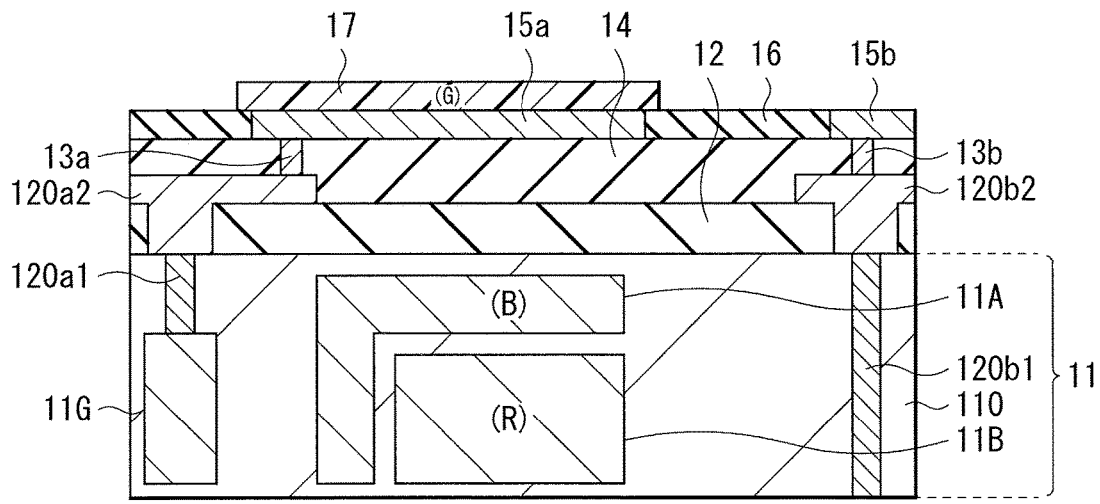
[FIG. 7C]
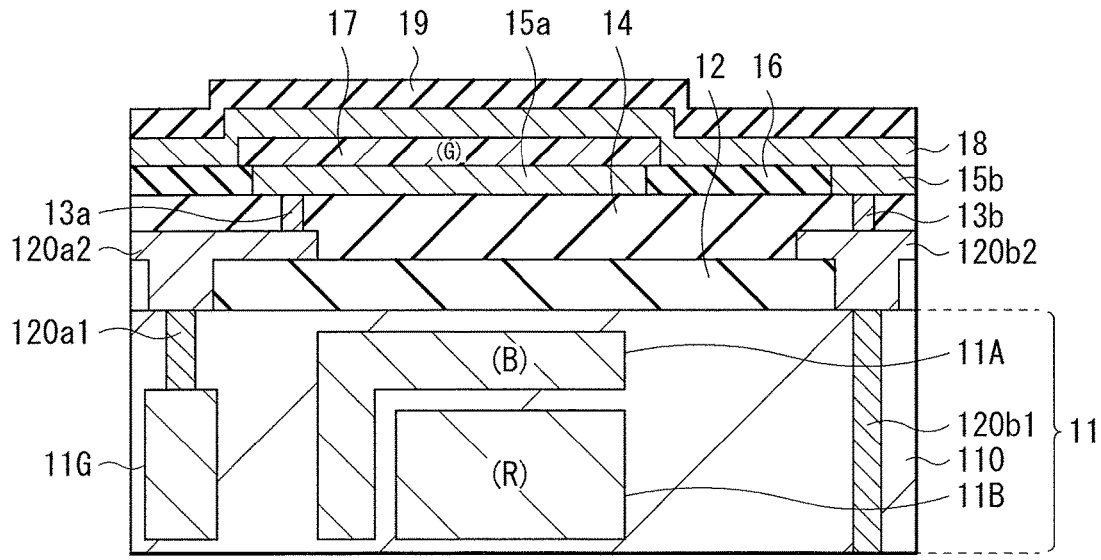

[ FIG. 8 ]
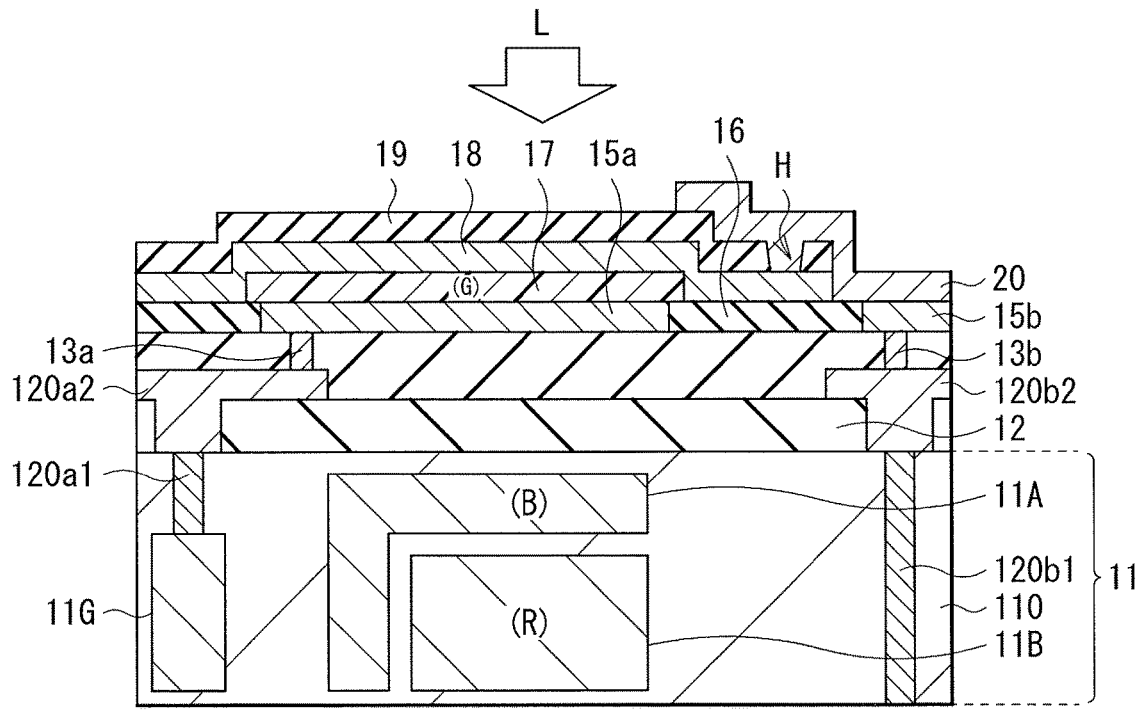
[ FIG. 9 ]
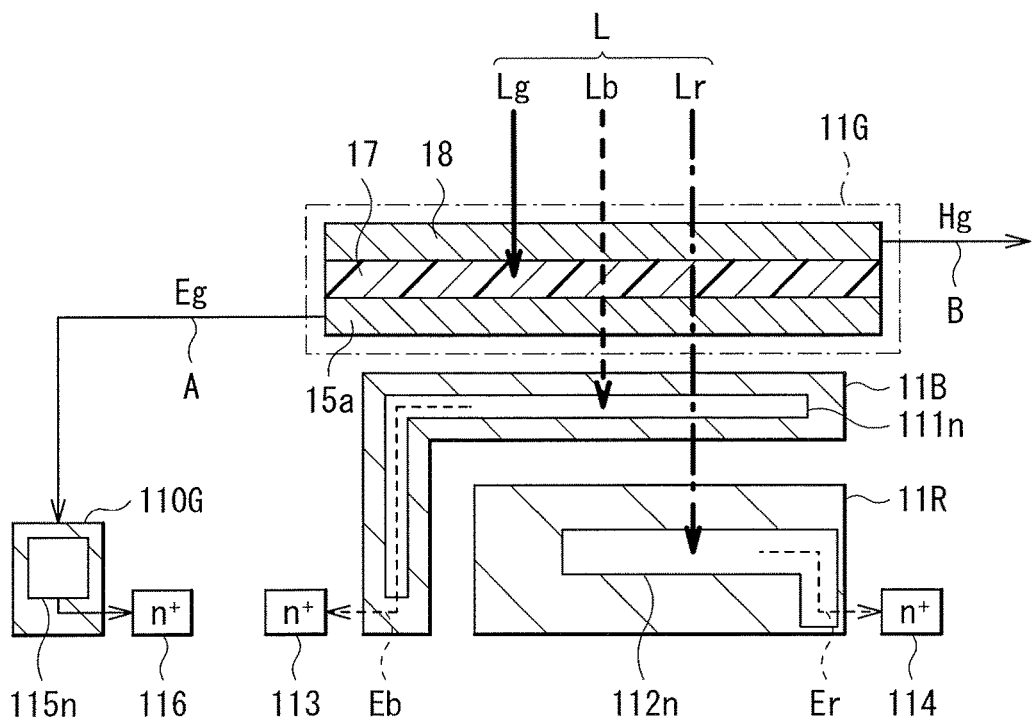

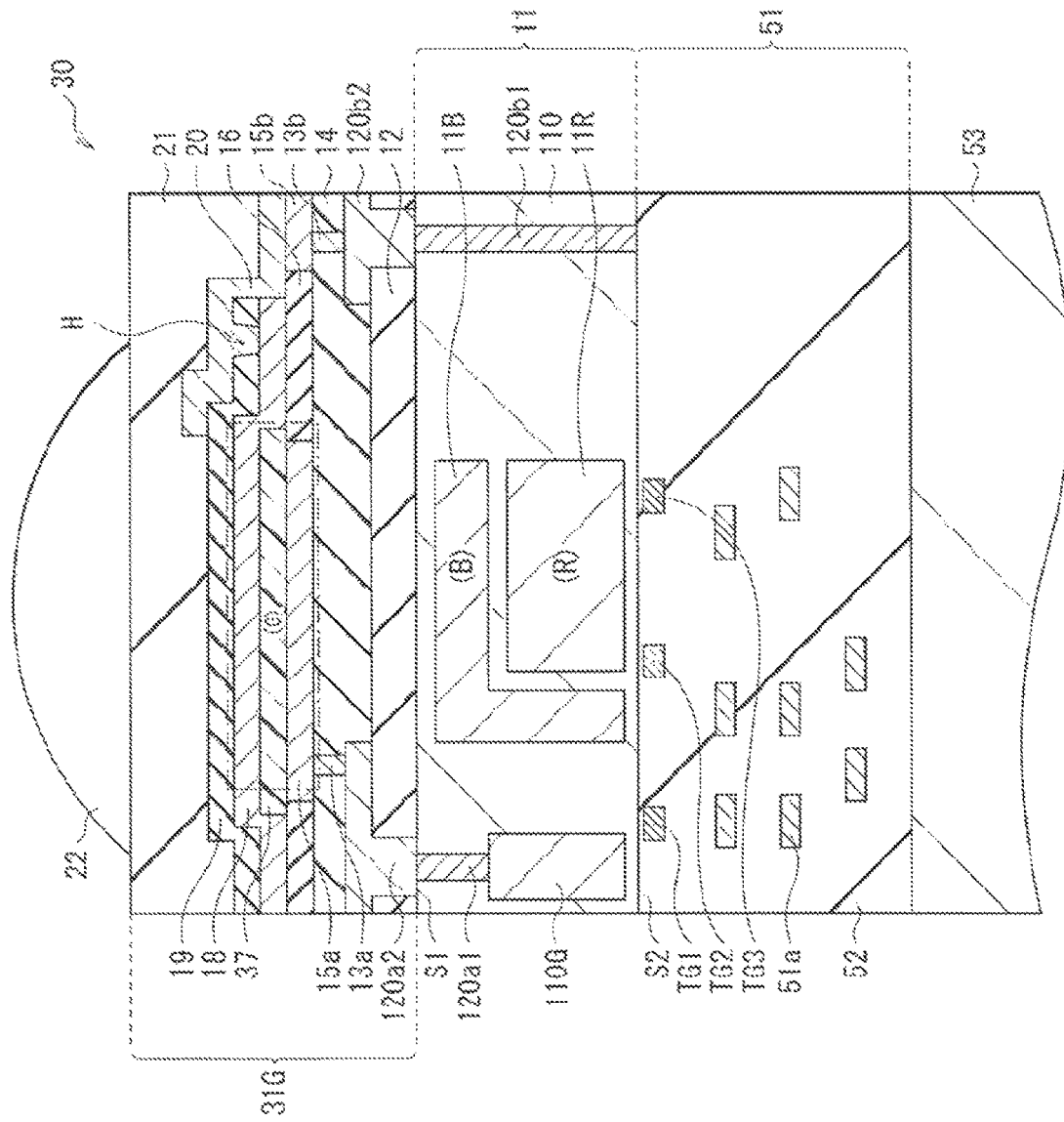
[FIG. 10]

[ FIG. 11 ]
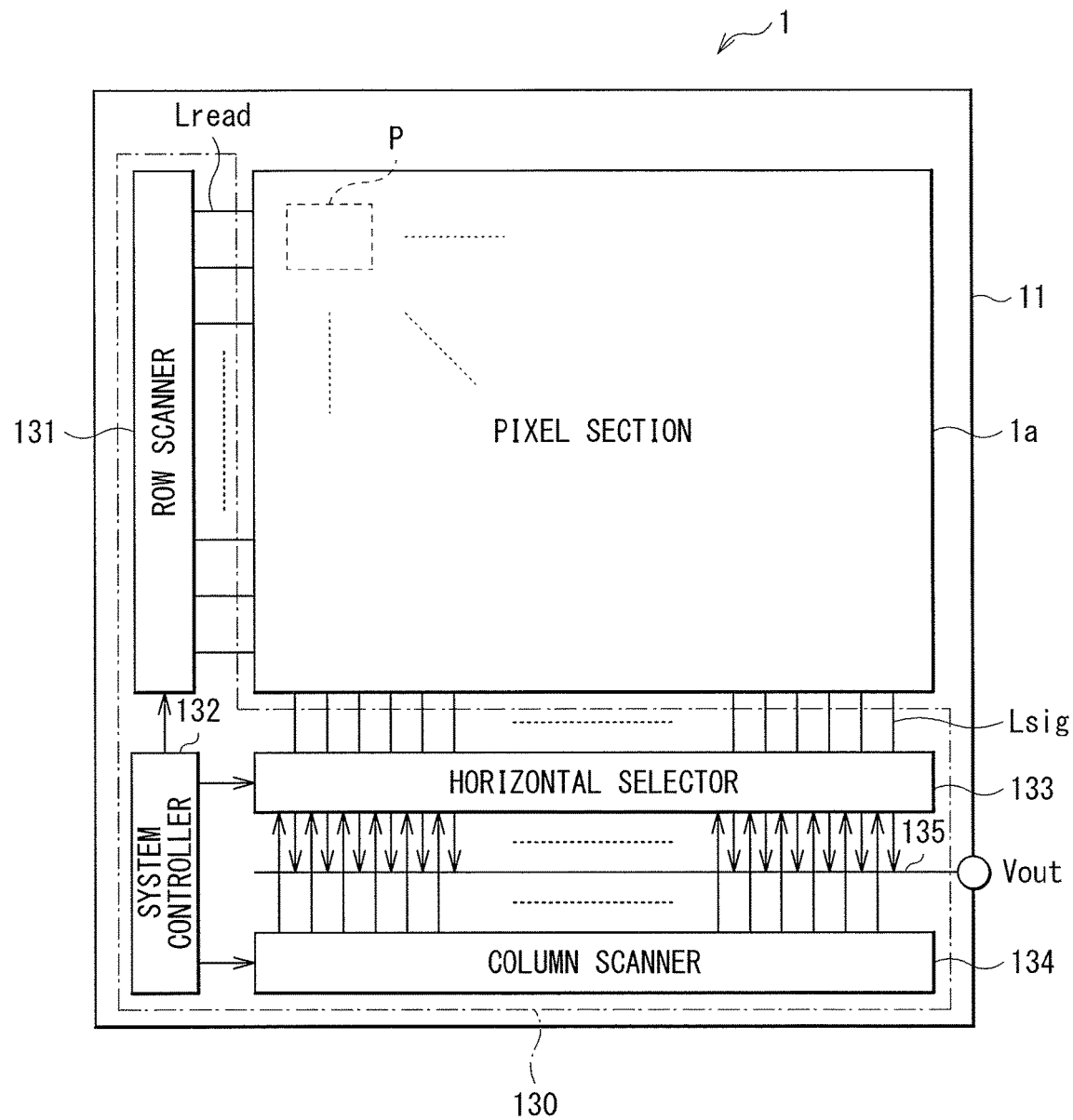

[ FIG. 12 ]
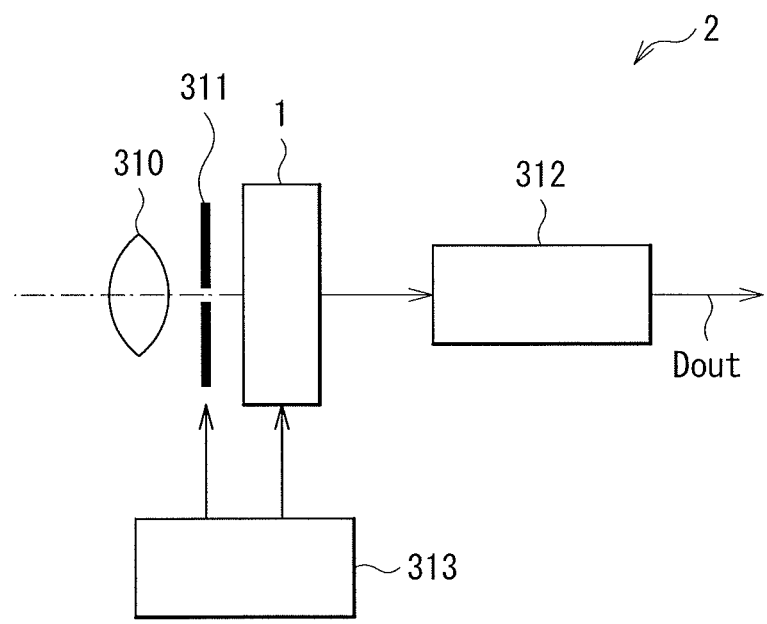

PHOTOELECTRIC CONVERSION ELEMENT AND SOLID-STATE IMAGING DEVICE

TECHNICAL FIELD

The present disclosure relates to, for example, a photoelectric conversion element using an organic semiconductor and a solid-state imaging device including the same.

BACKGROUND ART

In recent years, in solid-state imaging devices such as CCD (Charge Coupled Device) image sensors or CMOS (Complementary Metal Oxide Semiconductor) image sensors, reduction in pixel size has accelerated. This reduces the number of photons entering a unit pixel, which results in reduction in sensitivity and reduction in S/N ratio. Moreover, in a case where a color filter including a two-dimensional array of primary-color filters of red, green, and blue is used for colorization, in a red pixel, green light and blue light are absorbed by the color filter, which causes reduction in sensitivity. Further, in order to generate each color signal, interpolation between pixels is performed, which causes so-called false color.

Accordingly, for example, PTL 1 discloses an image sensor using an organic photoelectric conversion film having a multilayer configuration in which an organic photoelectric conversion film having sensitivity to blue light (B), an organic photoelectric conversion film having sensitivity to green light (G), and an organic photoelectric conversion film having sensitivity to red light (R) are stacked in order. In this image sensor, signals of B, G, and R are separately extracted from one pixel to achieve an improvement in sensitivity. PTL 2 discloses an imaging element in which an organic photoelectric conversion film including a single layer is formed, a signal of one color is extracted from the organic photoelectric conversion film, and signals of two colors are extracted by silicon (Si) bulk spectroscopy. In so-called stacked imaging elements (image sensors) disclosed in PTLs 1 and 2, most of incident light is subjected to photoelectric conversion and is read, which results in visible light use efficiency of nearly 100%. Moreover, each light receiver obtains color signals of three colors R, G, and B, which makes it possible to generate an image having high sensitivity and high resolution (invisible false color).

Accordingly, for example, PTL 3 disclosures a solid-state imaging element including a photoelectric conversion film that contains quinacridone or a derivative thereof in order to achieve a further improvement in sensitivity, that is, improvements in external quantum efficiency (EQE) and a spectroscopic shape. Moreover, NPL 1 reports an image sensor having responsivity improved by a photoelectric conversion layer containing dimethylquinacridone and subphthalocyanines.

CITATION LIST

Patent Literature

PTL 1: Japanese Unexamined Patent Application Publication No. 2003-234460
PTL 2: Japanese Unexamined Patent Application Publication No. 2005-303266
PTL 3: Japanese Unexamined Patent Application Publication No. 2007-234651

Non-Patent Literature

NPL 1: J. Phys. Chem. C 2014, 118, 13424-13431

SUMMARY OF THE INVENTION

However, in a case where one or two characteristics of the spectroscopic shape, responsivity, and EQE are improved, there is an issue that the other characteristics are deteriorated.

It is therefore desirable to provide a photoelectric conversion element and a solid-state imaging device that allow for achievement of a superior spectroscopic shape, high responsivity, and high external quantum efficiency.

A photoelectric conversion element according to an embodiment of the present disclosure includes: a first electrode and a second electrode facing each other; and a photoelectric conversion layer provided between the first electrode and the second electrode, and including a first quinacridone derivative represented by the following formula (1).

[Chem. 1]

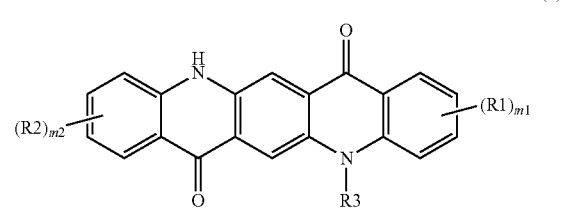

(1)

(where each of R1 and R2 is independently one of an alkyl group, an alkenyl group, an alkynyl group, an aryl group, a cyano group, a nitro group, and a silyl group, each of m1 and m2 is independently 0 or an integer of 1 or more, in a case where each of m1 and m2 is 2 or more, two or more R1 are optionally bound to one another to form a ring and two or more R2 are optionally bound to one another to form a ring, and R3 is one of an alkyl group, an aryl group, and a heterocyclic group.)

A solid-state imaging device according to an embodiment of the present disclosure includes pixels each including one or more organic photoelectric converters, and includes the photoelectric conversion element according to the foregoing embodiment of the present disclosure as each of the organic photoelectric converters.

In the photoelectric conversion element according to the embodiment of the present disclosure and the solid-state imaging device according to the embodiment of the present disclosure, the photoelectric conversion layer between the first electrode and the second electrode facing each other is formed using the first quinacridone derivative represented by the foregoing formula (1), which improves carrier (hole and electron) transport performance and carrier use efficiency in the photoelectric conversion layer.

According to the photoelectric conversion element of the embodiment of the present disclosure and the solid-state imaging device of the embodiment of the present disclosure, the photoelectric conversion layer is formed using the first quinacridone derivative represented by the foregoing formula (1), which improves carrier transport performance and use efficiency in the photoelectric conversion layer. This makes it possible to improve responsivity and external quantum efficiency while maintaining a sharp spectroscopic shape. In other words, it is possible to provide a photoelectric conversion element achieving a superior spectroscopic shape, high responsivity, and high EQE, and a solid-state imaging device including the photoelectric conversion element. It is to be noted that effects described herein are not necessarily limited, and any of effects described in the present disclosure may be included.

BRIEF DESCRIPTION OF THE DRAWINGS

FIG. 1 is a cross-sectional view of a schematic configuration of a photoelectric conversion element according to a first embodiment of the present disclosure.

FIG. 2 is a plan view of a relationship among forming positions of an organic photoelectric conversion layer, a protective layer (an upper electrode), and a contact hole.

FIG. 3A is a cross-sectional view of a configuration example of an inorganic photoelectric converter.

FIG. 3B is another cross-sectional view of the inorganic photoelectric converter illustrated in FIG. 3A.

FIG. 4 is a cross-sectional view of a configuration (lower-side electron extraction) of an electric charge (electron) storage layer of an organic photoelectric converter.

FIG. 5A is a cross-sectional view for description of a method of manufacturing the photoelectric conversion element illustrated in FIG. 1.

FIG. 5B is a cross-sectional view of a process subsequent to the process in FIG. 5A.

FIG. 6A is a cross-sectional view of a process subsequent to the process in FIG. 5B.

FIG. 6B is a cross-sectional view of a process subsequent to the process in FIG. 6A.

FIG. 7A is a cross-sectional view of a process subsequent to the process in FIG. 6B.

FIG. 7B is a cross-sectional view of a process subsequent to the process in FIG. 7A.

FIG. 7C is a cross-sectional view of a process subsequent to the process in FIG. 7B.

FIG. 8 is a main-part cross-sectional view that describes workings of the photoelectric conversion element illustrated in FIG. 1.

FIG. 9 is a schematic view for description of workings of the photoelectric conversion element illustrated in FIG. 1.

FIG. 10 is a cross-sectional view of a schematic configuration of a photoelectric conversion element according to a second embodiment of the present disclosure.

FIG. 11 is a functional block diagram of a solid-state imaging device using the photoelectric conversion element illustrated in FIG. 1 as a pixel.

FIG. 12 is a block diagram illustrating a schematic configuration of an electronic apparatus using the solid-state imaging device illustrated in FIG. 11.

MODES FOR CARRYING OUT THE INVENTION

In the following, some embodiments of the present disclosure are described in detail with reference to the drawings. It is to be noted that description is given in the following order.
1. First Embodiment (An example in which an organic photoelectric conversion layer is formed using an HR-type quinacridone derivative)
　1-1. Configuration of Photoelectric Conversion Element
　1-2. Method of Manufacturing Photoelectric Conversion Element
　1-3. Workings and Effects
2. Second Embodiment (An example in which an organic photoelectric conversion layer is formed using two kinds of quinacridone derivatives, i.e., HR-type and HH-type quinacridone derivatives)
3. Application Examples
4. Examples 1. First Embodiment FIG. 1 illustrates a cross-sectional configuration of a photoelectric conversion element (a photoelectric conversion element 10) according to a first embodiment of the present disclosure. The photoelectric conversion element 10 configures, for example, one pixel of a solid-state imaging device (to be described later) such as a CCD image sensor and a CMOS image sensor. In the photoelectric conversion element 10, a pixel transistor (including transfer transistors Tr1 to Tr3 to be described later) is formed and a multilayer wiring layer (a multilayer wiring layer 51) is included on a front surface (a surface S2 opposite to a light reception surface) of a semiconductor substrate 11.

The photoelectric conversion element 10 according to the present embodiment has a configuration in which one organic photoelectric converter 1G and two inorganic photoelectric converters 11B and 11R are stacked along a vertical direction. Each of the organic photoelectric converter 10L and the inorganic photoelectric converters 11B and 11R selectively detects light in a relevant one of wavelength regions different from one another, and performs photoelectric conversion on the thus-detected light. The organic photoelectric converter 11G is formed using a quinacridone derivative (a first quinacridone derivative) represented by a formula (1) to be described later.

(1-1. Configuration of Photoelectric Conversion Element)

The photoelectric conversion element 10 has a stacked configuration including one organic photoelectric converter 11G and two inorganic photoelectric converters 11B and 11R, which allows one element to obtain respective color signals of red (R), green (G), and blue (B). The organic photoelectric converter 11G is formed on a back surface (a surface S1) of the semiconductor substrate 11, and the inorganic photoelectric converters 11B and 11R are formed to be embedded in the semiconductor substrate 11. Hereinafter, description is given of configurations of respective components.

(Organic Photoelectric Converter 11G)

The organic photoelectric converter 11G is an organic photoelectric conversion element that absorbs light in a selective wavelength region (green light herein) with use of an organic semiconductor to generate electron-hole pairs. The organic photoelectric converter 11G has a configuration in which an organic photoelectric conversion layer 17 is sandwiched between a pair of electrodes (a lower electrode 15a and an upper electrode 18) for extraction of signal electric charges. The lower electrode 15a and the upper electrode 18 are electrically coupled to conductive plugs 120a1 and 120b1 embedded in the semiconductor substrate 11 through a wiring layer and a contact metal layer, as described later. It is to be noted that the organic photoelectric conversion layer 17 corresponds to a specific example of an "organic semiconductor layer" in the present disclosure.

Specifically, in the organic photoelectric converter 11G, interlayer insulating films 12 and 14 are formed on the surface SI of the semiconductor substrate 11, and the interlayer insulating film 12 is provided with through holes in regions facing the respective conductive plugs 120a1 and 120b1 to be described later. Each of the through holes is filled with a relevant one of conductive plugs 120a2 and 120b2. In the interlayer insulating film 14, wiring layers 13a and 13b are respectively embedded in regions facing the conductive plugs 120a2 and 120b2. The lower electrode 15a and the wiring layer 15b are provided on the interlayer insulating film 14. The wiring layer 15b is electrically isolated by the lower electrode 15a and an insulating film 16. The organic photoelectric conversion layer 17 is formed on the lower electrode 15a out of them, and the upper electrode 18 is so formed as to cover the organic photoelectric conversion layer 17. As described in detail later, a protective layer 19 is so formed on the upper electrode 18 as to cover a surface of the upper electrode 18. The protective layer 19 is provided with a contact hole H in a predetermined region, and a contact metal layer 20 is so formed on the protective layer 19 as to be contained in the contact hole H and to extend to a top surface of the wiring layer 15b.

The conductive plug 120a2 serves as a connector together with the conductive plug 120a1, and forms, together with the conductive plug 120a1 and the wiring layer 13a, a transmission path of electric charges (electrons) from the lower electrode 15a to a green electric storage layer 110G to be described later. The conductive plug 120b2 serves as a connector together with the conductive plug 120b, and the conductive plug 120b2 forms, together with the conductive plug 120b1, the wiring layer 13b, the wiring layer 15b, and the contact metal layer 20, a discharge path of electric charges (holes) from the upper electrode 18. In order to allow each of the conductive plugs 120a2 and 120b2 to also serve as a light-blocking film, each of the conductive plugs 120a2 and 120b2 desirably includes, for example, a laminated film including metal materials such as titanium (Ti), titanium nitride (TiN), and tungsten. Moreover, such a laminated film is desirably used, which makes it possible to secure contact with silicon even in a case where each of the conductive plugs 120a1 and 120b1 is formed as an n-type or p-type semiconductor layer.

The interlayer insulating film 12 desirably includes an insulating film having a small interface state in order to reduce an interface state with the semiconductor substrate 11 (a silicon layer 110) and to suppress generation of a dark current from an interface with the silicon layer 110. As such an insulating film, it is possible to use, for example, a laminated film including a hafnium oxide (HfO$_2$) film and a silicon oxide (SiO$_2$) film. The interlayer insulating film 14 includes a single-layer film including one of materials such as silicon oxide, silicon nitride, and silicon oxynitride (SiON), or includes a laminated film including two or more of these materials.

The insulating film 16 includes, for example, a single-layer film including one of materials such as silicon oxide, silicon nitride, and silicon oxynitride (SiON) or a laminated film including two or more of these materials. The insulating film 16 has, for example, a planarized surface, thereby having a shape and a pattern that each have almost no difference in level between the insulating film 16 and the lower electrode 15a. In a case where the photoelectric conversion element 10 is used as each of pixels of the solid-state imaging device, the insulating film 16 has a function of electrically isolating the lower electrodes 15a of the respective pixels from one another.

The lower electrode 15a is provided in a region that faces light reception surfaces of the inorganic photoelectric converters 11B and 11R formed in the semiconductor substrate 11 and covers these light reception surfaces. The lower electrode 15a includes a conductive film having light transparency, and includes, for example, ITO (indium tin oxide). Alternatively, as a constituent material of the lower electrode 15a, other than ITO, a tin oxide (SnO$_2$)-based material doped with a dopant or a zinc oxide-based material prepared by doping aluminum zinc oxide (ZnO) with a dopant may be used. Examples of the zinc oxide-based material include aluminum zinc oxide (AZO) doped with aluminum (Al) as a dopant, gallium zinc oxide (GZO) doped with gallium (Ga), and indium zinc oxide (IZO) doped with indium (In). Moreover, other than these materials, for example, CuI, InSbO$_4$, ZnMgO, CuInO$_2$, MgIN$_2$O$_4$, CdO, ZnSnO$_3$, etc. may be used. It is to be noted that in the present embodiment, signal electric charges (electrons) are extracted from the lower electrode 15a; therefore, in the solid-state imaging device to be described later that uses the photoelectric conversion element 10 as each of the pixels, the lower electrode 15a is formed separately for each of the pixels.

The organic photoelectric conversion layer 17 includes one or both of an organic p-type semiconductor and an organic n-type semiconductor. Moreover, the organic photoelectric conversion layer 17 performs photoelectric conversion on light in a selective wavelength region, and allows light in other wavelength regions to pass therethrough. Herein, the organic photoelectric conversion layer 17 has, for example, a maximal absorption wavelength in a range from 450 nm to 650 am both inclusive.

In the present embedment, the organic photoelectric conversion layer 17 preferably uses a quinacridone derivative represented by the following formula (1), that is, a so-called HR-type quinacridone derivative in which one of two amine sites in a molecule is secondary amine (NHRR') and the other is tertiary amine (NRR'R"), because the HR-type quinacridone derivative has relatively small crystal grains (grains) to be formed in a film. Accordingly, carriers (holes and electrons) efficiently move in an interface between the crystal grains (a crystal grain boundary). Moreover, a carrier trap derived from a gap between the grains is reduced.

[Chem. 2]

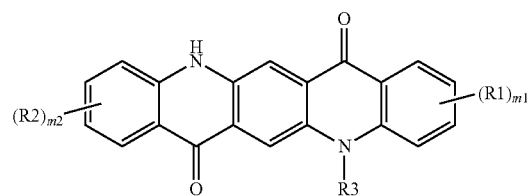

(1)

(where each of R1 and R2 is independently one of an alkyl group, an alkenyl group, an alkynyl group, an aryl group, a cyano group, a nitro group, and a silyl group, each of m1 and m2 is independently 0 or an integer of 1 or more, in a case where each of m1 and m2 is 2 or more, two or more R1 are optionally bound to one another to form a ring and two or more R2 are optionally bound to one another to form a ring, and R3 is one of an alkyl group, an aryl group, and a heterocyclic group.)

Specific examples of the quinacridone derivative represented by the foregoing formula (1) include compounds represented by the following formulas (1-1) to (1-16), etc.

[Chem. 3A]
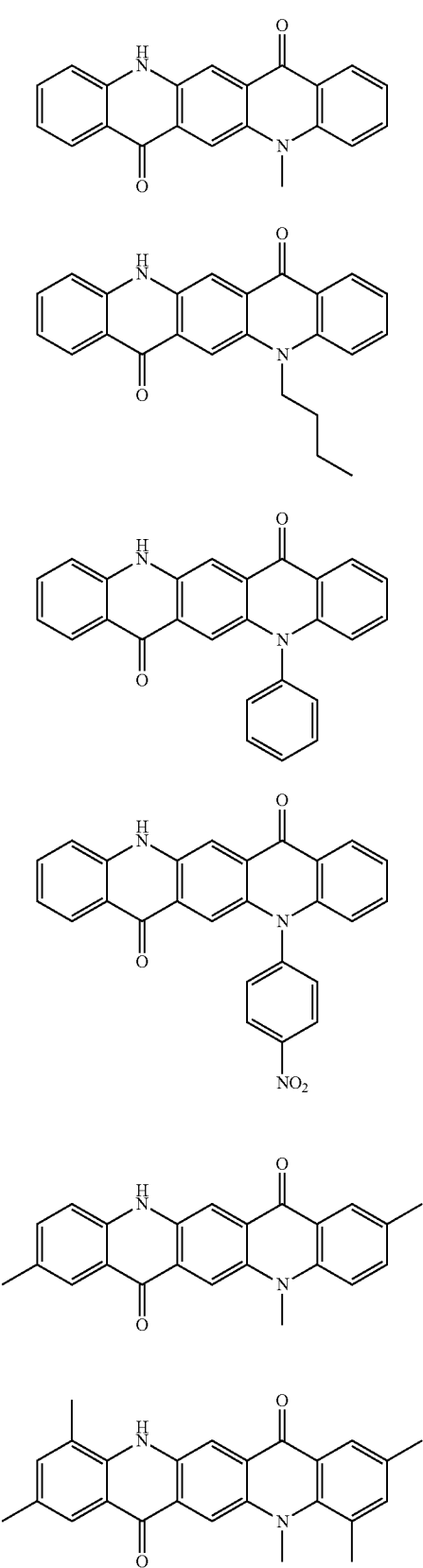
[Chem. 3B]

-continued

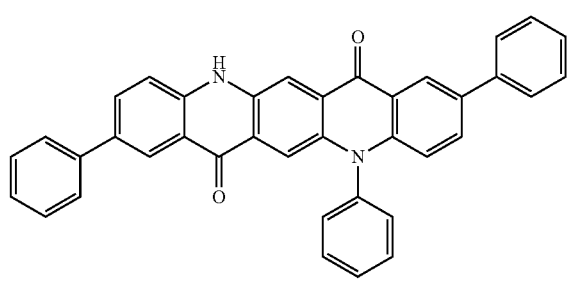
(1-13)

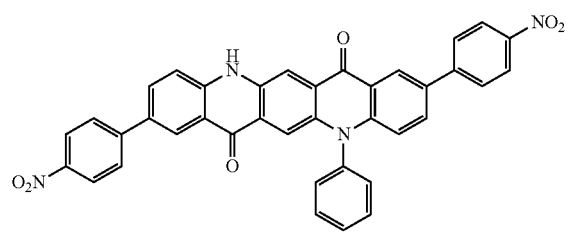
(1-14)

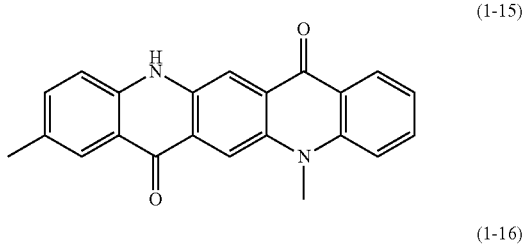
(1-15)

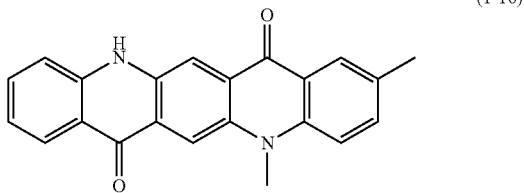
(1-16)

Moreover, the organic photoelectric conversion layer 17 preferably includes a subphthalocyanine derivative represented by the following formula (2) together with the foregoing HR-type quinacridone derivative.

[Chem. 4]

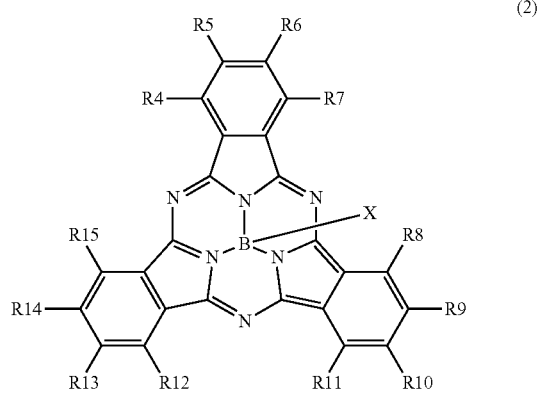
(2)

(where each of R4 to R15 is independently a hydrogen atom, a halogen atom, a straight-chain, branched, or cyclic alkyl group, a thioalkyl group, a thioaryl group, an arylsulfonyl group, an alkylsulfonyl group, an amino group, an alkylamino group, an arylamino group, a hydroxy group, an alkoxy group, an acylamino group, an acyloxy group, a phenyl group, a carboxy group, a carboxyamide group, a carboalkoxy group, an acyl group, a sulfonyl group, a cyano group, and a nitro group, any adjacent ones of R4 to R15 are optionally bound to one another to form a ring, and X is an anionic group.)

Specific examples of the subphthalocyanine derivative represented by the formula (2) include compounds represented by the following formulas (2-1) to (2-4), etc.

[Chem. 5]

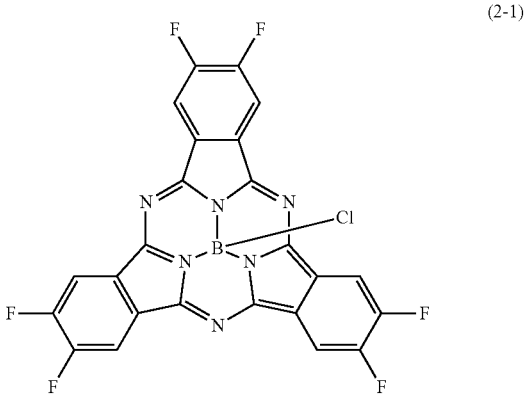
(2-1)

(2-2)

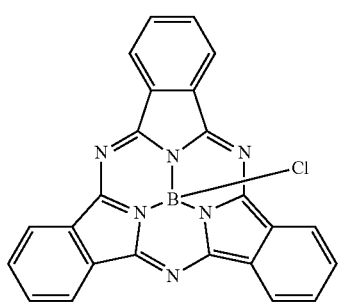
(2-3)

-continued

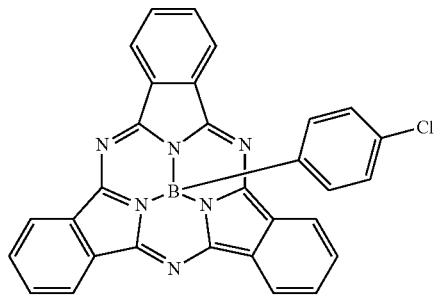

(2-4)

It is to be noted that in the present embodiment, the foregoing HR-type quinacridone derivative serves as an organic p-type semiconductor, and the foregoing subphthalocyanine derivative serves as an organic n-type semiconductor.

The organic photoelectric conversion layer 17 preferably includes the HR-type quinacridone derivative represented by the foregoing formula (1) within, for example, a range from 25% to 75% both inclusive in volume ratio. A content of the HR-type quinacridone derivative is within the foregoing range, which reduces a bias in probabilities that p-type HR-type quinacridone derivatives are adjacent each other, the n-type subphthalocyanine derivatives are adjacent each other, and the p-type HR-type quinacridone derivative and the n-type subphthalocyanine derivative are adjacent to each other in the organic photoelectric conversion layer 17. Accordingly, a possibility that an exciton reaches an interface between the p-type HR-type quinacridone derivative and the n-type subphthalocyanine derivative is ensured. Moreover, transport efficiency of holes passing through between the adjacent p-type HR-type quinacridone derivatives and transport efficiency of electrons passing through between the adjacent n-type subphthalocyanine derivatives after exciton dissociation are ensured. This makes high external quantum efficiency and high responsivity compatible.

Any other unillustrated layer may be provided between the organic photoelectric conversion layer 17 and the lower electrodes 15a and between the organic photoelectric conversion layer 17 and the upper electrode 18. For example, an undercoat film, a hole transport layer, an electron blocking film, the organic photoelectric conversion layer 17, a hole blocking film, a buffer film, an electron transport layer, and a work function adjustment film may be stacked in order from the lower electrode 15a.

The upper electrode 18 includes a conductive film having light transparency, as with the lower electrode 15a. In the solid-state imaging device using the photoelectric conversion element 10 as each of the pixels, the upper electrode 18 may be separately provided for each of the pixels, or may be formed as a common electrode for the respective pixels. The upper electrode 18 has, for example, a thickness of 10 nm to 200 nm both inclusive.

The protective layer 19 includes a material having light transparency, and is, for example, a single-layer film including one of materials such as silicon oxide, silicon nitride, and silicon oxynitride or a laminated film including two or more of these materials. The protective layer 19 has, for example, a thickness of 100 nm to 30000 nm both inclusive.

The contact metal layer 20 includes, for example, one of materials such as titanium, tungsten, titanium nitride, and aluminum, or includes a laminated film including two or more of these materials.

The upper electrode 18 and the protective layer 19 are so provided as to cover the organic photoelectric conversion layer 17, for example. FIG. 2 illustrates planar configurations of the organic photoelectric conversion layer 17, the protective layer 19 (the upper electrode 18), and the contact hole H.

Specifically, an edge e2 of the protective layer 19 (the upper electrode 18 is similar to the protective layer 19) is located outside of an edge e1 of the organic photoelectric conversion layer 17, and the protective layer 19 and the upper electrode 18 are so formed as to protrude toward outside of the organic photoelectric conversion layer 17. More specifically, the upper electrode 18 is so formed as to cover a top surface and a side surface of the organic photoelectric conversion layer 17, and as to extend onto the insulating film 16. The protective layer 19 is so formed as to cover a top surface of such an upper electrode 18, and is formed in a similar planar shape to that of the upper electrode 18. The contact hole H is provided in a region not facing the organic photoelectric conversion layer 17 (a region outside of the edge e1) of the protective layer 19, and allows a portion of a surface of the upper electrode 18 to be exposed from the contact hole H. A distance between the edges e1 and e2 is not particularly limited, but is, for example, within a range from 1 μm to 500 μm both inclusive. It is to be noted that in FIG. 2, one rectangular contact hole H along an end side of the organic photoelectric conversion layer 17 is provided; however, a shape of the contact hole H and the number of the contact holes H are not limited thereto, and the contact hole H may have any other shape (for example, a circular shape, a square shape, etc.), and a plurality of contact holes H may be provided.

The planarization layer 21 is so formed on the protective layer 19 and the contact metal layer 20 as to cover entire surfaces of the protective layer 19 and the contact metal layer 20. An on-chip lens 22 (a microlens) is provided on the planarization layer 21. The on-chip lens 22 concentrates light incoming from a top of the on-chip lens 22 onto each of light reception surfaces of the organic photoelectric converter 11G and the inorganic photoelectric converters 11B and 11R. In the present embodiment, the multilayer wiring layer 51 is formed on the surface S2 of the semiconductor substrate 11, which makes it possible to dispose the respective light reception surfaces of the organic photoelectric converter 11G and the inorganic photoelectric converters 11B and 11R close to one another, and to reduce variation in sensitivity between respective colors that is caused depending on an F-number of the on-chip lens 22.

It is to be noted that in the photoelectric conversion element 10 according to the present embodiment, signal electric charges (electrons) are extracted from the lower electrode 15a; therefore, in the solid-state imaging device using the photoelectric conversion element 10 as each of the pixels, the upper electrode 18 may be a common electrode. In this case, a transmission path including the contact hole H, the contact metal layer 20, the wiring layers 15b and 13b, the conductive plugs 120b1 and 120b2 mentioned above may be formed at least at one position for all pixels.

In the semiconductor substrate 11, for example, the inorganic photoelectric converters 11B and 11R and the green electric storage layer 110G are so formed as to be embedded in a predetermined region of the n-type silicon (Si) layer 110. Moreover, the conductive plugs 120a1 and 120b1 configuring a transmission path of electric charges (electrons or holes (holes)) from the organic photoelectric converter 11G are embedded in the semiconductor substrate 11. In the present embodiment, a back surface (the surface S1) of the semiconductor substrate 11 serves as a light reception surface. A plurality of pixel transistors (including transfer transistors Tr1 to Tr3) corresponding to the organic photoelectric converter 11G and the inorganic photoelectric converters 11B and 11R, and a peripheral circuit including a logic circuit, etc. are formed on a side on which the front surface (the surface S2) is located of the semiconductor substrate 11.

Examples of the pixel transistor include a transfer transistor, a reset transistor, an amplification transistor, and a selection transistor. Each of these pixel transistors includes, for example, a MOS transistor, and is formed in a p-type semiconductor well region on a side on which the surface S2 is located. A circuit including such pixel transistors is formed for each of photoelectric converters of red, green, and blue. Each of the circuits may have, for example, a three-transistor configuration including three transistors in total, i.e., the transfer transistor, the reset transistor, and the amplification transistor out of these pixel transistors, or may have, for example, a four-transistor configuration further including the selection transistor in addition to the three transistors mentioned above. Only the transfer transistors Tr1 to Tr3 of these pixel transistors are illustrated and described hereinbelow. Moreover, it is possible to share the pixel transistors other than the transfer transistor among the photoelectric converters or among the pixels. Further, a so-called pixel sharing configuration in which a floating diffusion is shared is applicable.

The transfer transistors Tr1 to Tr3 include gate electrodes (gate electrodes TG1 to TG3) and floating diffusions (FD 113, 114, and 116). The transfer transistor Tr1 transfers, to a vertical signal line Lsig to be described later, signal electric charges (electrons in the present embodiment) corresponding to green that are generated in the organic photoelectric converter 11G and stored in the green electric storage layer 110G. The transfer transistor Tr2 transfers, to the vertical signal line Lsig to be described later, signal electric charges (electrons in the present embodiment) corresponding to blue that are generated and stored in the inorganic photoelectric converter 11B. Likewise, the transfer transistor Tr3 transfers, to the vertical signal line Lsig to be described later, signal electric charges (electrons in the present embodiment) corresponding to red that are generated and stored in the inorganic photoelectric converter 11R.

The inorganic photoelectric converters 11B and 11R are each a photodiode having a p-n junction, and are formed in an optical path in the semiconductor substrate 11 in this order from the surface S1. The inorganic photoelectric converter 11B of the inorganic photoelectric converters 11B and 11R selectively detects blue light and stores signal electric charges corresponding to blue, and is so formed as to extend, for example, from a selective region along the surface SI of the semiconductor substrate 11 to a region in proximity to an interface with the multilayer wiring layer 51. The inorganic photoelectric converter 11R selectively detects red light and stores signal electric charges corresponding to red, and is formed, for example, in a region below the inorganic photoelectric converter 11B (closer to the surface S2). It is to be noted that blue (B) and red (R) are, for example, a color corresponding to a wavelength region from 450 nm to 495 nm both inclusive and a color corresponding to a wavelength region from 620 nm to 750 am both inclusive, respectively, and each of the inorganic photoelectric converters 11B and 11R may be allowed to detect light of part or the entirety of the relevant wavelength region.

FIG. 3(A) illustrates specific configuration examples of the inorganic photoelectric converters 11B and 11R. FIG. 3(B) corresponds to a configuration in other cross-section of FIG. 3(A). It is to be noted that in the present embodiment, description is given of a case where electrons of electron-hole pairs generated by photoelectric conversion are read as signal electric charges (a case where an n-type semiconductor region serves as a photoelectric conversion layer). Moreover, in the drawings, a superscript "+(plus)" placed at "p" or "n" indicates that p-type or n-type impurity concentration is high. Further, gate electrodes TG2 and TG3 of the transfer transistors Tr2 and Tr3 out of the pixel transistors are also illustrated.

The inorganic photoelectric converter 11B includes, for example, a p-type semiconductor region (hereinafter simply referred to as p-type region, an n-type semiconductor region is referred in a similar manner) 111p serving as a hole storage layer and an n-type photoelectric conversion layer (an n-type region) 111n serving as an electron storage layer. The p-type region 111p and the n-type photoelectric conversion layer 111n are formed in respective selective regions in proximity to the surface S1, and are bent and extend to allow a portion thereof to reach an interface with the surface S2. The p-type region 111p is coupled to an unillustrated p-type semiconductor well region on a side on which the surface S is located. The n-type photoelectric conversion layer 111n is coupled to the FD 113 (an n-type region) of the transfer transistor Tr2 for blue. It is to be noted that a p-type region 113p (a hole storage layer) is formed in proximity to an interface between each of ends on the side on which the surface S2 is located of the p-type region 111p and the n-type photoelectric conversion layer 111n and the surface S2.

The inorganic photoelectric converter 11R is formed, for example, by sandwiching an n-type photoelectric conversion layer 112n (an electron storage layer) between the p-type regions 112p1 and 112p2 (bole storage layers) (that is, has a p-n-p laminated structure). The n-type photoelectric conversion layer 112n is bent and extends to allow a portion thereof to reach an interface with the surface S2. The n-type photoelectric conversion layer 112n is coupled to the FD 114 (an n-type region) of the transfer transistor Tr3 for red. It is to be noted that a p-type region 113p (a hole storage layer) is formed at least in proximity to an interface between the end on the side on which the surface S2 is located of the n-type photoelectric conversion layer 111n and the surface S2.

FIG. 4 illustrates a specific configuration example of the green electric storage layer 110G. It is to be noted that hereinafter, description is given of a case where electrons of electrons-hole pairs generated by the organic photoelectric converter 11G are read as signal electric charges from the lower electrode 15a. Moreover, the gate electrode TG1 of the transfer transistor Tr1 out of the pixel transistors is also illustrated in FIG. 4.

The green electric storage layer 110G includes an n-type region 115n serving as an electron storage layer. A portion of the n-type region 115n is coupled to the conductive plug 120a1, and stores electrons transmitted from the lower electrode 15a through the conductive plug 120a1. The n-type region 115n is also coupled to the FD 116 (an n-type region) of the transfer transistor Tr1 for green. It is to be noted that a p-type region 115p (a hole storage layer) is formed in proximity to an interface between the n-type region 115n and the surface S2.

The conductive plugs 120a1 and 120b2 serve as connectors between the organic photoelectric converter 11G and the semiconductor substrate 11 together with the conductive plugs 120a2 and 120a2 to be described later, and configure a transmission path of electrons or holes generated in the organic photoelectric converter 11G. In the present embodiment, the conductive plug 120a1 is brought into conduction with the lower electrode 15a of the organic photoelectric converter 11G, and is coupled to the green electric storage layer 110G. The conductive plug 120b1 is brought into conduction with the upper electrode 18 of the organic photoelectric converter 11G, and serves as a wiring line for discharge of holes.

Each of the conductive plugs 120a1 and 120b1 includes, for example, a conductive semiconductor layer, and is so formed as to be embedded in the semiconductor substrate 11. In this case, the conductive plug 120a1 is of an n type (to serve as an electron transmission path), and the conductive plug 120b1 may be of a p type (to serve as a hole transmission path). Alternatively, each of the conductive plugs 120a1 and 120b1 may be, for example, a conductive film material such as tungsten contained in a through via. In this case, for example, to suppress a short circuit with silicon, it is desirable to cover a via side surface with an insulating film including silicon oxide ($SiO_2$), silicon nitride (SiN), or the like.

The multilayer wiring layer 51 is formed on the surface S2 of the semiconductor substrate 11. In the multilayer wiring layer 51, a plurality of wiring lines 51a are provided with an interlayer insulating film 52 in between. As described above, in the photoelectric conversion element 10, the multilayer wiring layer 51 is formed on a side opposite to the light reception surface, which makes it possible to achieve a so-called back-side illumination type solid-state imaging device. For example, a supporting substrate 53 including silicon is bonded to the multilayer wiring layer 51.

(1-2. Method of Manufacturing Photoelectric Conversion Element)

It is possible to manufacture the photoelectric conversion element 10 as follows, for example. FIGS. 5A to 7C illustrate a method of manufacturing the photoelectric conversion element 10 in process order. It is to be noted that FIGS. 7A to 7C illustrate only a main-part configuration of the photoelectric conversion element 10. It is to be noted that a method of fabricating the photoelectric conversion element 10 to be described below is merely an example, and the method of fabricating the photoelectric conversion element 10 (and a photoelectric conversion element 30 to be described later) according to the embodiment of the present disclosure is not limited to the following example.

First, the semiconductor substrate 11 is formed. Specifically, a so-called SOI substrate is prepared. In the SOI substrate, the silicon layer 110 is formed on a silicon base 1101 with a silicon oxide film 1102 in between. It is to be noted that a surface on a side on which the silicon oxide film 1102 is located, of the silicon layer 110 serves as the back surface (the surface S1) of the semiconductor substrate 11. FIGS. 5A and 5B illustrate a state in which a configuration illustrated in FIG. 1 is vertically inverted. Next, the conductive plugs 120a1 and 120b1 are formed in the silicon layer 110, as illustrated in FIG. 5A. At this occasion, for example, through vias are formed in the silicon layer 110, and thereafter, a barrier metal such as silicon nitride described above and tungsten are contained in the through vias, which makes it possible to form the conductive plugs 120a1 and 120b1. Alternatively, a conductive impurity semiconductor layer may be formed by, for example, ion implantation on the silicon layer 110. In this case, the conductive plug 120a1 is formed as an n-type semiconductor layer, and the conductive plug 120b1 is formed as a p-type semiconductor layer. Thereafter, the inorganic photoelectric converters 11B and 11R each having, for example, the p-type region and the n-type region as illustrated in FIG. 3A are formed by ion implantation in regions located at depths different from each other in the silicon layer 110 (to be superimposed on each other). Moreover, the green electric storage layer 110G is formed by ion implantation in a region adjacent to the conductive plug 120a1. Thus, the semiconductor substrate 11 is formed.

Subsequently, the pixel transistors including the transfer transistors Tr1 to Tr3 and peripheral circuits such as a logic circuit are formed on the side on which the surface S2 is located of the semiconductor substrate 11, and thereafter, a plurality of layers of wiring lines 51a are formed on the surface S2 of the semiconductor substrate 11 with the interlayer insulating film 52 in between to form the multilayer wiring layer 51, as illustrated in FIG. 5B. Next, the supporting substrate 53 including silicon is bonded onto the multilayer wiring layer 51, and thereafter, the silicon base 1101 and the silicon oxide film 1102 are removed from the surface SI of the semiconductor substrate 11 to expose the surface S of the semiconductor substrate 11.

Next, the organic photoelectric converter 11G is formed on the surface S1 of the semiconductor substrate 11. Specifically, first, the interlayer insulating film 12 that includes the foregoing laminated film including the hafnium oxide film and the silicon oxide film is formed on the surface S1 of the semiconductor substrate 11, as illustrated in FIG. 6A. For example, after the hafnium oxide film is formed by an ALD (atomic layer deposition) method, the silicon oxide film is formed by, for example, a plasma CVD (Chemical Vapor Deposition) method. Thereafter, the contact holes H1a and H1b are formed at positions facing the conductive plugs 120a1 and 120b1 of the interlayer insulating film 12, and the conductive plugs 120a2 and 120b2 including the foregoing material are formed so as to be contained in the contact holes H1a and H1b, respectively. At this occasion, the conductive plugs 120a2 and 120b2 may be formed to protrude to a region to be light-blocked (to cover the region to be light-blocked), or a light-blocking layer may be formed in a region isolated from the conductive plugs 120a2 and 120b2.

Subsequently, the interlayer insulating film 14 including the foregoing material is formed by, for example, a plasma CVD method, as illustrated in FIG. 6B. It is to be noted that after film formation, a front surface of the interlayer insulating film 14 is desirably planarized by, for example, a CMP (Chemical Mechanical Polishing) method. Next, contact holes are formed at positions facing the conductive plugs 120a2 and 120b2 of the interlayer insulating film 14, and the contact holes are filled with the foregoing material to form the wiring layers 13a and 13b. It is to be noted that, thereafter, a surplus wiring layer material (such as tungsten) on the interlayer insulating film 14 is desirably removed by a CMP method, etc. Next, the lower electrode 15a is formed on the interlayer insulating film 14. Specifically, first, the foregoing transparent conductive film is formed on the entire surface of the interlayer insulating film 14 by, for example, a sputtering method. Thereafter, a selective portion is removed with use of a photolithography method (through performing light exposure, development, post-baking, etc. on a photoresist film), for example, with use of dry etching or wet etching to form the lower electrode 15a. At this occasion, the lower electrode 15a is formed in a region facing the wiring layer 13a. Moreover, in processing of the transparent conductive film, the transparent conductive film remains also in a region facing the wiring layer 13b to form, together with the lower electrode 15a, the wiring layer 15b configuring a portion of a hole transmission path.

Subsequently, the insulating film 16 is formed. At this occasion, first, the insulating film 16 including the foregoing material is formed by, for example, a plasma CVD method on the entire surface of the semiconductor substrate 11 to cover the interlayer insulating film 14, the lower electrode 15a, and the wiring layer 15b. Thereafter, the formed insulating film 16 is polished by, for example, a CMP method to expose the lower electrode 15a and the wiring layer 15b from the insulating film 16 and to reduce (desirably eliminate) a difference in level between the lower electrode 15a and the insulating film 16, as illustrated in FIG. 7A.

Next, the organic photoelectric conversion layer 17 is formed on the lower electrode 15a, as illustrated in FIG. 7B. At this occasion, pattern formation of the HR-type quinacridone derivative and the subphthalocyanine derivative mentioned above is performed by, for example, a vacuum deposition method. It is to be noted that in a case where another organic layer (such as an electron blocking layer) is formed above or below the organic photoelectric conversion layer 17 as described above, the organic layer is desirably formed continuously in a vacuum process (in-situ vacuum process). Moreover, the method of forming the organic photoelectric conversion layer 17 is not necessarily limited to a technique using the foregoing vacuum deposition method, and any other technique, for example, a print technology may be used.

Subsequently, the upper electrode 18 and the protective layer 19 are formed, as illustrated in FIG. 7C. First, the upper electrode 18 including the foregoing transparent conductive film is formed on an entire substrate surface by, for example, a vacuum deposition method or a sputtering method to cover a top surface and a side surface of the organic photoelectric conversion layer 17. It is to be noted that characteristics of the organic photoelectric conversion layer 17 easily vary by an influence of water, oxygen, hydrogen, etc.; therefore, the upper electrode 18 is desirably formed by an in-situ vacuum process together with the organic photoelectric conversion layer 17. Thereafter (before pattering the upper electrode 18), the protective layer 19 including the foregoing material is formed by, for example, a plasma CVD method to cover a top surface of the upper electrode 18. Subsequently, after the protective layer 19 is formed on the upper electrode 18, the upper electrode 18 is processed.

Thereafter, selective portions of the upper electrode 18 and the protective layer 19 are collectively removed by etching using a photolithography method. Subsequently, the contact hole H is formed in the protective layer 19 by, for example, etching using a photolithography method. At this occasion, the contact hole H is desirably formed in a region not facing the organic photoelectric conversion layer 17. Even after formation of the contact hole H, a photoresist is removed, and cleaning using a chemical solution is performed by a method similar to the foregoing method; therefore, the upper electrode 18 is exposed from the protective layer 19 in a region facing the contact hole H. Accordingly, in view of generation of a pin hole as described above, the contact hole H is desirably provided in a region other than a region where the organic photoelectric conversion layer 17 is formed. Subsequently, the contact metal layer 20 including the foregoing material is formed with use of, for example, a sputtering method, etc. At this occasion, the contact metal layer 20 is formed on the protective layer 19 to be contained in the contact hole H and extend to a top surface of the wiring layer 15b. Lastly, the planarization layer 21 is formed on the entire surface of the semiconductor substrate 11, and thereafter, the on-chip lens 22 is formed on the planarization layer 21. Thus, the photoelectric conversion element 10 illustrated in FIG. 1 is completed.

In the foregoing photoelectric conversion element 10, for example, as the pixel of the solid-state imaging device, signal electric charges are obtained as follows. More specifically, as illustrated in FIG. 8, light L enters the photoelectric conversion element 10 through the on-chip lens 22 (not illustrated in FIG. 8), and thereafter, the light L passes through the organic photoelectric converter 11G and the inorganic photoelectric converters 11B and 11R in this order. Each of green light, blue light, and red light of the light L is subjected to photoelectric conversion in the course of passing. FIG. 9 schematically illustrates a flow of obtaining signal electric charges (electrons) on the basis of incident light. Hereinafter, description is given of a specific signal obtaining operation in each photoelectric converter.

(Obtaining of Green Signal by Organic Photoelectric Converter 11G)

First, green light Lg of the light L having entered the photoelectric conversion element 10 is selectively detected (absorbed) by the organic photoelectric converter 11G to be subjected to photoelectric conversion. Electrons Eg of thus-generated electron-hole pairs are extracted from the lower electrode 15a, and thereafter, the electrons Eg are stored in the green electric storage layer 110G through a transmission path A (the wiring layer 13a and the conductive plugs 120a1 and 120a2). The stored electrons Eg are transferred to the FD 116 in a reading operation. It is to be noted that holes Hg are discharged from the upper electrode 18 through a transmission path B (the contact metal layer 20, the wiring layers 13b and 15b, and the conductive plugs 120b1 and 120b2).

Specifically, the signal electric charges are stored as follows. Namely, in the present embodiment, a predetermined negative potential VL (<0 V) and a potential VU (<VL) lower than the potential VL are applied to the lower electrode 15a and the upper electrode 18, respectively. It is to be noted that the potential VL are applied to the lower electrode 15a from, for example, the wiring line 51a in the multilayer wiring layer 51 through the transmission path A. The potential VL is applied to the upper electrode 18 from, for example, the wiring line 51a in the multilayer wiring layer 51 through the transmission path B. Thus, in an electric charge storing state (an OFF state of the unillustrated reset transistor and the transfer transistor Tr1), electrons of the electron-hole pairs generated in the organic photoelectric conversion layer 17 are guided to the lower electrode 15a having a relatively high potential (holes are guided to the upper electrode 18). Thus, the electrons Eg are extracted from the lower electrode 15a to be stored in the green electric storage layer 110G (specifically, the n-type region 115n) through the transmission path A. Moreover, storage of the electrons Eg changes the potential VL of the lower electrode 15a brought into conduction with the green electric storage layer 110G. A change amount of the potential VL corresponds to a signal potential (herein, a potential of a green signal).

Moreover, in a reading operation, the transfer transistor Tr1 is turned to an ON state, and the electrons Eg stored in the green electric storage layer 110G are transferred to the FD 116. Accordingly, a green signal based on a light reception amount of the green light Lg is read to the vertical signal line Lsig to be described later through an unillustrated other pixel transistor. Thereafter, the unillustrated reset transistor and the transfer transistor Tr1 are turned to an ON state, and the FD 116 as the n-type region and a storage region (the n-type region 115*n*) of the green electric storage layer 110G are reset to, for example, a power source voltage VDD.

(Obtaining of Blue Signal and Red Signal by Inorganic Photoelectric Converters 11B and 11R)

Next, blue light and red light of light having passed through the organic photoelectric converter 11G are absorbed in order by the inorganic photoelectric converter 11B and the inorganic photoelectric converter 11R, respectively, to be subjected to photoelectric conversion. In the inorganic photoelectric converter 11B, electrons Eb corresponding to the blue light having entered the inorganic photoelectric converter 11B are stored in the n-type region (the n-type photoelectric conversion layer 111*n*), and the stored electrons Ed are transferred to the FD 113 in the reading operation. It is to be noted that holes are stored in an unillustrated p-type region. Likewise, in the inorganic photoelectric converter 11R, electrons Er corresponding to the red light having entered the inorganic photoelectric converter 11R are stored in the n-type region (the n-type photoelectric conversion layer 112*n*), and the stored electrons Er are transferred to the FD 114 in the reading operation. It is to be noted that holes are stored in an unillustrated p-type region.

In the electric charge storing state, the negative potential VL is applied to the lower electrode 15*a* of the organic photoelectric converter 11G, as described above, which causes a tendency to increase hole concentration in the p-type region (the p-type region 111*p* in FIG. 2) as a hole storage layer of the inorganic photoelectric converter 11B. This makes it possible to suppress generation of a dark current at an interface between the p-type region 111*p* and the interlayer insulating film 12.

In the reading operation, as with the foregoing organic photoelectric converter 11G, the transfer transistors Tr2 and Tr3 are turned to an ON state, and the electrons Eb stored in the n-type photoelectric conversion layer 111*n* and the electrons Er stored in the n-type photoelectric conversion layer 112*n* are transferred to the FDs 113 and 114, respectively. Accordingly, each of a blue signal based on a light reception amount of the blue light Lb and a red signal based on a light reception amount of the red light Lr is read to the vertical signal line Lsig to be described later through an unillustrated other pixel transistor. Thereafter, the unillustrated reset transistor and the transfer transistors Tr2 and Tr3 are turned to the ON state, and the FDs 113 and 114 as the n-type regions are reset to, for example, the power source voltage VDD.

As described above, the organic photoelectric converter 11G and the inorganic photoelectric converters 11B and 11R are stacked along the vertical direction, which makes it possible to separately detect red light, green light, and blue light without providing a color filter, thereby obtaining signal electric charges of respective colors. This makes it possible to suppress light loss (reduction in sensitivity) resulting from color light absorption by the color filter and generation of false color associated with pixel interpolation processing.

(1-3. Workings and Effects)

A typical solid-state imaging device adopts, for example, a so-called bulk-hetero structure in which a photoelectric converter (an organic photoelectric converter) including an organic material and an inorganic photoelectric converter including an inorganic material such as Si are stacked. In this solid-state imaging device, co-evaporation of the organic p-type organic semiconductor material and the organic n-type organic semiconductor material in the organic photoelectric converter makes it possible to increase an electric charge separation interface, thereby achieving high conversion efficiency. In recent years, as described above, in solid-state imaging devices such as CCD image sensors and CMOS image sensors, high color reproducibility, a high frame rate, and high sensitivity have been in demand, and the spectroscopic shape has been further improved, and responsivity and external quantum efficiency have been improved.

Various imaging devices have been developed in order to achieve a superior spectroscopic shape, high responsivity, and high external quantum efficiency, and in particular, a photoelectric conversion element using a quinacridone derivative is expected. For example, in a photoelectric conversion element using a combination of a quinacridone derivative and a subphthalocyanine derivative, a superior spectroscopic shape and high external quantum efficiency are confirmed. However, it is difficult to achieve three characteristics, that is, the spectroscopic shape, responsivity, and external quantum efficiency. In the foregoing photoelectric conversion element using the combination of the quinacridone derivative and the subphthalocyanine derivative, the spectroscopic shape and external quantum efficiency are improved, but a sufficient characteristic related to responsivity is not achieved.

In contrast, in the present embodiment, the organic photoelectric conversion layer 17 is formed using the quinacridone derivative represented by the foregoing formula (1). This quinacridone derivative represented by the formula (1) is the HR-type quinacridone derivative in which one of two amine sites in a molecule is secondary amine (NHRR') and the other is tertiary amine (NRR'R").

The quinacridone derivative used in the foregoing photoelectric conversion element including the combination of the quinacridone derivative and the subphthalocyanine derivative is a so-called HH-type quinacridone derivative in which both two amine sites in a molecule are secondary amine (NHRR') or a so-called RR-type quinacridone derivative in which both two amine sites in a molecule are tertiary amine (NRR'R"). The HH-type quinacridone derivative generally has high crystallinity. Accordingly, heat resistance is superior, but a grain size formed in a film such as a photoelectric conversion layer is large, which deteriorates carrier movement efficiency in an interface between grains. Accordingly, it is considered that it is difficult to improve responsivity. The RR-type quinacridone derivative also has high crystallinity, as with the HH-type quinacridone derivative. Accordingly, it is assumed that it is difficult to improve responsivity due to the same reason as that in the HH-type quinacridone derivative.

In contrast, the HR-type quinacridone derivative has relatively small crystal grains (grains) to be formed in a film. Accordingly, carriers efficiently move in an interface between the grains. It is therefore assumed that carrier transport performance in the organic photoelectric conversion layer 17 is improved and responsivity is improved. Moreover, a carrier trap derived from a gap between the grains is reduced, which improves carrier use efficiency.

As described above, in the photoelectric conversion element 10 according to the present embodiment, the organic photoelectric conversion layer 17 is formed using the HR-type quinacridone derivative represented by the foregoing formula (1), which improves carrier transport performance and use efficiency in the organic photoelectric conversion layer 17. This makes it possible to improve responsivity and external quantum efficiency while maintaining a sharp spectroscopic shape. In other words, it is possible to provide a photoelectric conversion element achieving a superior spectroscopic shape, high responsivity, and high external quantum efficiency.

2. Second Embodiment

FIG. 10 illustrates a cross-sectional configuration of a photoelectric conversion element 30 according to a second embodiment of the present disclosure. The photoelectric conversion element 30 has a cross-sectional configuration similar to that of the photoelectric conversion element 10 according to the foregoing first embodiment, and configures, for example, one pixel in a solid-state imaging device (to be described later) such as a CCD image sensor or a CMOS image sensor. In the photoelectric conversion element 30 according to the present embodiment, an organic photoelectric conversion layer 37 configuring an organic photoelectric converter 31G is formed using a quinacridone derivative (a second quinacridone derivative) represented by a formula (3) to be described later together with the HR-type quinacridone derivative represented by the foregoing formula (1). It is to be noted that components same as those in the first embodiment are denoted by the same reference numerals, and description of such components is appropriately omitted.

The organic photoelectric conversion layer 37 includes one or both of an organic p-type semiconductor and an organic n-type semiconductor. Moreover, the organic photoelectric conversion layer 37 performs photoelectric conversion on light in a selective wavelength region (herein, light within a range from 450 nm to 650 nm both inclusive), and allows light in other wavelength regions to pass therethrough. The organic photoelectric conversion layer 37 in the present embodiment is formed using two kinds of quinacridone derivatives. The two kinds of quinacridone derivatives are the HR-type quinacridone derivative represented by the formula (1) and the quinacridone derivative represented by the following formula (3). The quinacridone derivative represented by the formula (3) is a so-called HH-type quinacridone derivative in which both two amine sites in a molecule are secondary amine (NHRR').

[Chem. 6]

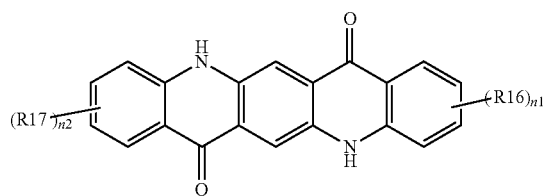

(3)

(where each of R16 and R17 is independently one of an alkyl group, an alkenyl group, an alkynyl group, an aryl group, a cyano group, a nitro group, and a silyl group, each of n1 and n2 is independently 0 or an integer of 1 or more, and in a case where each of n1 and n2 is 2 or more, two or more R16 are optionally bound to one another to form a ring and two or more R17 are optionally bound to one another to form a ring.)

Specific examples of the quinacridone derivative represented by the foregoing formula (3) include compounds represented by the following formulas (3-1) to (3-4), etc.

[Chem. 7]

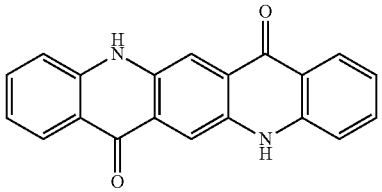

(3-1)

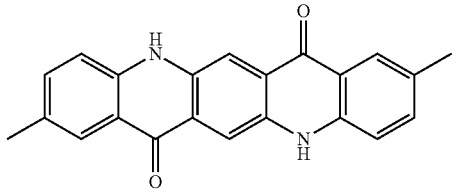

(3-2)

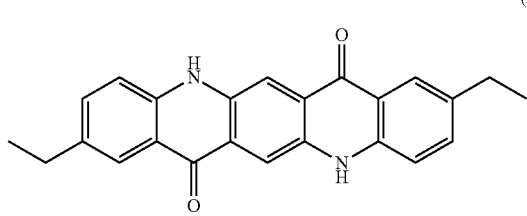

(3-3)

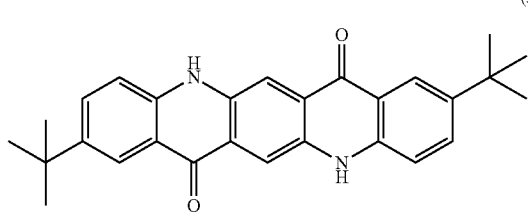

(3-4)

Moreover, the organic photoelectric conversion layer 37 preferably includes the subphthalocyanine derivative represented by the foregoing formula (2) together with the HR-type quinacridone derivative and the HH-type quinacridone derivative.

It is to be noted that in the present embodiment, each of the HR-type quinacridone derivative and the HH-type quinacridone derivative described above serves as an organic p-type semiconductor, and the foregoing subphthalocyanine derivative serves as an organic n-type semiconductor.

The organic photoelectric conversion layer 37 preferably includes the HR-type quinacridone derivative represented by the formula (1) and the HH-type quinacridone derivative represented by the foregoing formula (3) within, for example, a range from 25% to 75% both inclusive in volume ratio. A total content of the two kinds of quinacridone derivatives is within the foregoing range, which makes it possible to further improve external quantum efficiency in addition to an improvement in responsivity. Moreover, as contents of the HR-type quinacridone derivative and the HH-type quinacridone derivative, the HR-type quinacridone derivative is preferably included within, for example, a range from 33% to 67% both inclusive in volume ratio. Including the HR-type quinacridone derivative within this range makes responsivity and external quantum efficiency compatible in a better balanced manner.

As described above, in the photoelectric conversion element 30 according to the present embodiment, the organic photoelectric conversion layer 37 is formed using the HR-type quinacridone derivative and the HH-type quinacridone derivative represented by the foregoing formula (3). This improves carrier use efficiency in the organic photoelectric conversion layer 37, which achieves, in addition to the effects in the first embodiment, an effect that it is possible to further improve external quantum efficiency.

3. Application Examples

Application Example 1

FIG. 11 illustrates an entire configuration of a solid-state imaging device (the solid-state imaging device 1) using the photoelectric conversion element 10 (or the photoelectric conversion element 30) described in the foregoing embodiments as each of the pixels. The solid-state imaging device 1 is a CMOS image sensor, and includes a pixel section 1a as an imaging region and a peripheral circuit section 130 in a peripheral region of the pixel section 1a on the semiconductor substrate 11. The peripheral circuit section 130 includes, for example, a row scanner 131, a horizontal selector 133, a column scanner 134, and a system controller 132.

The pixel section 1a includes, for example, a plurality of unit pixels P (each corresponding to the photoelectric conversion element 10) that are two-dimensionally arranged in rows and columns. The unit pixels P are wired with pixel driving lines Lread (specifically, row selection lines and reset control lines) for respective pixel rows, and are wired with vertical signal lines Lsig for respective pixel columns. The pixel driving lines Lread transmit drive signals for signal reading from the pixels. The pixel driving lines Lread each have one end coupled to a corresponding one of output terminals, corresponding to the respective rows, of the row scanner 131.

The row scanner 131 is, for example, a pixel driver that includes a shift register, an address decoder, etc., and drives the unit pixels P of the pixel section 1a on a row basis. Signals outputted from the unit pixels P of a pixel row selected and scanned by the row scanner 131 are supplied to the horizontal selector 133 through the respective vertical signal lines Lsig. The horizontal selector 133 includes, for example, an amplifier, a horizontal selection switch, etc. that are provided for each of the vertical signal lines Lsig.

The column scanner 134 includes a shift register, an address decoder, etc., and drives the horizontal selection switches of the horizontal selector 133 in order while sequentially performing scanning of those horizontal selection switches. Such selection and scanning performed by the column scanner 134 allow the signals of the pixels transmitted through the respective vertical signal lines Lsig to be sequentially outputted to a horizontal signal line 135. The thus-outputted signals are transmitted to outside of the semiconductor substrate 11 through the horizontal signal line 135.

A circuit portion including the row scanner 131, the horizontal selector 133, the column scanner 134, and the horizontal signal line 135 may be provided directly on the semiconductor substrate 11, or may be disposed in an external control IC. Alternatively, the circuit portion may be provided in any other substrate coupled by means of a cable or the like.

The system controller 132 receives a clock supplied from the outside of the semiconductor substrate 11, data on instructions of operation modes, and the like, and outputs data such as internal information of the solid-state imaging device 1. Furthermore, the system controller 132 includes a timing generator that generates various timing signals, and performs drive control of peripheral circuits such as the row scanner 131, the horizontal selector 133, and the column scanner 134 on the basis of the various timing signals generated by the timing generator.

Application Example 2

The foregoing solid-state imaging device 1 is applicable to various kinds of electronic apparatuses having imaging functions. Examples of the electronic apparatuses include camera systems such as digital still cameras and video cameras, and mobile phones having imaging functions. FIG. 12 illustrates, for purpose of an example, a schematic configuration of an electronic apparatus 2 (a camera). The electronic apparatus 2 is, for example, a video camera that allows for shooting of a still image or a moving image. The electronic apparatus 2 includes the solid-state imaging device 1, an optical system (an optical lens) 310, a shutter unit 311, a driver 313, and a signal processor 312. The driver 313 drives the solid-state imaging device 1 and the shutter unit 311.

The optical system 310 guides image light (incident light) from an object toward the pixel section 1a of the solid-state imaging device 1. The optical system 310 may include a plurality of optical lenses. The shutter unit 311 controls a period in which the solid-state imaging device 1 is irradiated with the light and a period in which the light is blocked. The driver 313 controls a transfer operation of the solid-state imaging device 1 and a shutter operation of the shutter unit 311. The signal processor 312 performs various signal processes on signals outputted from the solid-state imaging device 1. A picture signal Dout having been subjected to the signal processes is stored in a storage medium such as a memory, or is outputted to a monitor or the like.

4. Examples

Hereinafter, various samples related to the first and second embodiments of the present disclosure were fabricated, and external quantum efficiency (EQE) and responsivity of the samples were evaluated.

Experiment 1

First, as a sample 1-1, a glass substrate provided with an ITO electrode having a film thickness of 50 nm was cleaned by UV/ozone treatment, and thereafter, N-methylquinacridone (MMQD) represented by the formula (1-1) and chloroborane (2,3,9,10,16,17-hexafluorosubphthalocyanine) ($F_6$SubPcCl) represented by the formula (2-1) were concurrently evaporated on the glass substrate by a resistance heating method under a reduced pressure of $1 \times 10^{-5}$ Pa or less with use of an organic evaporation apparatus while rotating a substrate holder to form the organic photoelectric conversion layer. Evaporation speeds of MMQD and $F_6$SubPcCl were 0.050 nm/sec and 0.050 nm/sec, respectively, and a film having a total thickness of 100 nm was formed. Moreover, a film of AlSiCu was formed as an upper electrode with a film thickness of 100 nm on the organic photoelectric conversion layer to fabricate a photoelectric conversion element having a 1 mm×1 mm photoelectric conversion region.

In addition, as samples 1-2 to 1-8, photoelectric conversion elements were fabricated by a method similar to that in the sample 1-1, using, in place of MMQD, quinacridone (QD; the sample 1-2) represented by the formula (3-1), 2,9-dimethylquinacridone (PR122; the sample 1-3) represented by the formula (3-2), 2,9-diethylquinacridone (EQD; the sample 1-4) represented by the formula (3-3), 2,9-di-tert-butylquinacridone (BQD; the sample 1-5) represented by the formula (3-4), N,N'-dimethylquinacridone (DMQD; the sample 1-6) represented by the following formula (4-1), N,N'-diphenylquinacridone (DPQD; the sample 1-7) represented by the following formula (4-2), and N,N'-diphenyl-2,9-di-tert-butylquinacridone (BPQD; the sample 1-8) represented by a formula (4-3). External quantum efficiency (EQE) and responsivity of the samples 1-1 to 1-7 were evaluated as follows. Table 1 summarizes configurations of the organic photoelectric conversion layers, types of quinacridone derivatives used for the organic photoelectric conversion layers, and evaluation results of EQE and responsivity in the sample 1-1 to 1-7. It is to be noted that each of the evaluation results of EQE and responsivity is a relative value with reference to the result in the sample 1-1 as a reference value.

[Chem. 8]

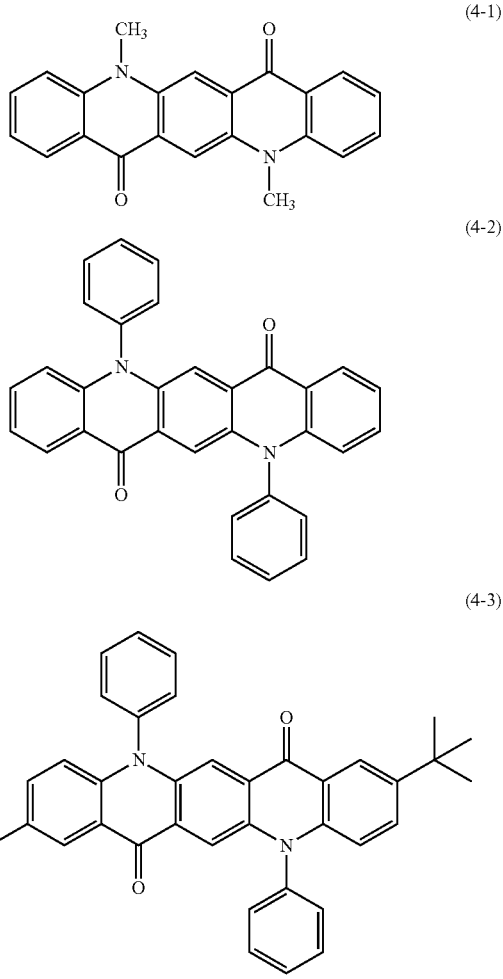

(Method of Evaluating External Quantum Efficiency)

External quantum efficiency was evaluated with use of a semiconductor parameter analyzer. Specifically, external quantum efficiency was calculated from a bright current value and a dark current value in a case where an amount of light to be applied from a light source to the photoelectric conversion element through a filter was 1.62 µW/cm$^2$, and a bias voltage to be applied between electrodes was −1 V.

(Method of Evaluating Responsivity)

Responsivity was evaluated by measuring speed of falling, after stopping application of light, a bright current value observed during application of light with use of a semiconductor parameter analyzer. Specifically, an amount of light to be applied from a light source to the photoelectric conversion element through a filter was 1.62 µW/cm$^2$, and a bias voltage to be applied between electrodes was −1 V. A stationary current was observed in this state, and thereafter, application of light was stopped, and how the current was attenuated was observed. Subsequently, a dark current value was subtracted from an obtained current-time curve. A current-time curve to be thereby obtained was used, and time necessary for a current value after stopping application of light to attenuate to 3% of an observed current value in a stationary state was an indication of responsivity.

TABLE 1

|  | Configuration of Photoelectric Conversion Layer | Type of QD derivative | EQE | Responsivity |
| --- | --- | --- | --- | --- |
| Sample 1-1 | Formula (1-1) | Formula (2-1) | HR | 1.0 | 1.0 |
| Sample 1-2 | Formula (3-1) | Formula (2-1) | HH | 2.1 | 8.0 |
| Sample 1-3 | Formula (3-2) | Formula (2-1) | HH | 1.9 | 7.6 |
| Sample 1-4 | Formula (3-3) | Formula (2-1) | HH | 2.3 | 5.0 |
| Sample 1-5 | Formula (3-4) | Formula (2-1) | HH | 2.2 | 4.0 |
| Sample 1-6 | Formula (4-1) | Formula (2-1) | RR | 0.9 | 2.0 |
| Sample 1-7 | Formula (4-2) | Formula (2-1) | RR | 0.2 | 2.0 |
| Sample 1-8 | Formula (4-3) | Formula (2-1) | RR | 0.6 | 8.0 |

As can be seen from Table 1, as compared with the sample 1-1 using the HR-type quinacridone derivative as the quinacridone derivative configuring the organic photoelectric conversion layer, in the samples 1-2 to 1-5 using the HH-type quinacridone derivative, external quantum efficiency was higher than that in the sample 1-1, but a large increase in the falling time, that is, a large deterioration in responsivity was observed. Moreover, in the samples 1-6 to 1-8 using the RR-type quinacridone derivative as the quinacridone derivative configuring the organic photoelectric conversion layer, both external quantum efficiency and responsivity were lower than those in the sample 1-1. Therefore, it was found that using the HR-type quinacridone derivative as the quinacridone derivative configuring the organic photoelectric conversion layer made external quantum efficiency and responsivity compatible.

Experiment 2

Next, photoelectric conversion elements (samples 2-1 to 2-6) were fabricated by a method similar to that in the foregoing experiment 1 except for the configuration of the organic photoelectric conversion layer, and external quantum efficiency (EQE) and responsivity of these samples were evaluated. As quinacridone derivatives used in the respective samples, MMQD represented by the formula (1-1) was used in the samples 2-1 and 2-2, QD represented by the formula (3-1) was used in the samples 2-3 and 2-4, and DMQD represented by the formula (4-1) was used in the samples 2-5 and 2-6. Moreover, as subphthalocyanine derivatives used for the respective samples, SubPsCl represented by the formula (2-3) was used in the samples 2-1, 2-3, and 2-5, and F$_6$SubPs-OPheCl represented by the formula (2-2) was used in the samples 2-2, 2-4, and 2-6. Table 2 summarizes configurations of the organic photoelectric conversion layers, types of quinacridone derivatives used for the organic photoelectric conversion layers, and evaluation results of EQE and responsivity in the sample 2-1 to 2-6. It is to be noted that each of the evaluation results of EQE and responsivity is a relative value with reference to the result in the sample 2-1 as a reference value.

TABLE 2

|  | Configuration of Photoelectric Conversion Layer | | Type of QD derivative | EQE | Responsivity |
| --- | --- | --- | --- | --- | --- |
| Sample 2-1 | Formula (1-1) | Formula (2-3) | HR | 1.0 | 1.0 |
| Sample 2-2 | Formula (1-1) | Formula (2-2) | HR | 1.2 | 0.6 |
| Sample 2-3 | Formula (3-1) | Formula (2-3) | HH | 2.4 | 10 |
| Sample 2-4 | Formula (3-1) | Formula (2-2) | HH | 2.4 | 8 |
| Sample 2-5 | Formula (4-1) | Formula (2-3) | RR | 0.2 | 4 |
| Sample 2-6 | Formula (4-1) | Formula (2-2) | RR | 0.2 | 5 |

As can be seen from Table 2, the quinacridone derivative configuring the organic photoelectric conversion layer had a tendency similar to the results in the experiment 1 irrespective of the kind of the subphthalocyanine derivative used together. In other words, as compared with the samples 2-1 and 2-2 using the HR-type quinacridone derivative as the quinacridone derivative configuring the organic photoelectric conversion layer, in the samples 2-3 and 2-4 using the HH-type quinacridone derivative, quantum efficiency was higher than that in the sample 2-1, but a large deterioration in responsivity was observed. Moreover, in the samples 2-5 and 2-6 using the RR-type quinacridone derivative as the quinacridone derivative configuring the organic photoelectric conversion layer, both external quantum efficiency and responsivity were lower than those in the samples 2-1 and 2-2.

Experiment 3

Next, photoelectric conversion elements (samples 3-1 to 3-12) were fabricated by a method similar to that in the foregoing experiment 1 except for the configuration of the organic photoelectric conversion layer, and external quantum efficiency and responsivity of these samples were evaluated. In the present experiment, the organic photoelectric conversion layer included two kinds of quinacridone derivatives and a subphthalocyanine derivative.

As a first type of quinacridone derivative used in the respective samples, MMQD represented by the formula (1-1) was used in the samples 3-1, 3-5, and 3-6, N-methyl-2,9-dimethylquinacridone (TMQD) represented by the formula (1-5) was used in the sample 3-2, N-methyl-2,9-di-tert-butylquinacridone (BMQD) represented by the formula (1-7) was used in the sample 3-3, and N-phenylquinacridone (MPQD) represented by the formula (1-3) was used in the samples 3-4 and 3-7. Moreover, DMQD represented by the formula (4-1) was used in the samples 3-8 and 3-9, DPQD represented by the formula (4-2) was used in the sample 3-10, BQD represented by the formula (3-4) was used in the sample 3-11, PR122 represented by the formula (3-2) was used in the sample 3-12, and EQD represented by the formula (3-3) was used in the sample 3-13. As a second type of quinacridone derivative, BQD represented by the formula (3-4) was used. As the subphthalocyanine derivative, FSub-PcCl represented by the formula (2-1) was used in the samples 3-1 to 3-4 and 3-6 to 3-13, except that $F_6$SubPs-OPhCl represented by the formula (2-2) was used in the sample 3-5. It is to be noted that in each of the samples 3-6 to 3-8, and 3-10, the second type of quinacridone derivative was not used to form the organic photoelectric conversion layer. Table 3 summarizes configurations of the organic photoelectric conversion layers, types of quinacridone derivatives used for the organic photoelectric conversion layers, and evaluation results of EQE and responsivity in the sample 3-1 to 3-13. It is to be noted that each of the evaluation results of EQE and responsivity is a relative value with reference to the result in the sample 3-1 as a reference value.

TABLE 3

|  | Configuration of Photoelectric Conversion Layer | | | Type of QD derivative | EQE | Responsivity |
| --- | --- | --- | --- | --- | --- | --- |
| Sample 3-1 | Formula (1-1) | Formula (3-4) | Formula (2-1) | HR + HH | 1.0 | 1.0 |
| Sample 3-2 | Formula (1-5) | Formula (3-4) | Formula (2-1) | HR + HH | 1.0 | 3.5 |
| Sample 3-3 | Formula (1-7) | Formula (3-4) | Formula (2-1) | HR + HH | 0.6 | 2.0 |
| Sample 3-4 | Formula (1-3) | Formula (3-4) | Formula (2-1) | HR + HH | 0.4 | 4.0 |
| Sample 3-5 | Formula (1-1) | Formula (3-4) | Formula (2-2) | HR + HH | 0.9 | 2.5 |
| Sample 3-6 | Formula (1-1) | — | Formula (2-1) | HR | 0.4 | 2.5 |
| Sample 3-7 | Formula (1-3) | — | Formula (2-1) | HR | 0.1 | 4.1 |
| Sample 3-8 | Formula (4-1) | — | Formula (2-1) | RR | 0.4 | 5.0 |
| Sample 3-9 | Formula (4-1) | Formula (3-4) | Formula (2-1) | RR + HH | 0.5 | 7.0 |
| Sample 3-10 | Formula (4-2) | Formula (3-4) | Formula (2-1) | RR + HH | 0.1 | 30 |
| Sample 3-11 | Formula (3-4) | — | Formula (2-1) | HH | 0.9 | 10 |
| Sample 3-12 | Formula (3-2) | Formula (3-4) | Formula (2-1) | HH + HH | 0.9 | 17 |
| Sample 3-13 | Formula (3-3) | Formula (3-4) | Formula (2-1) | HH + HH | 1.0 | 11 |

The following was found from Table 3. First, it was found that in the samples 3-1 to 3-5 in which the organic photoelectric conversion layer was formed using the HR-type quinacridone derivative and the HH-type quinacridone derivative, high EQE was obtained, as compared with the samples 3-6 and 3-7 using only the HR-type quinacridone derivative. Moreover, it was found that in the samples 3-1 to 3-5, high EQE and superior responsivity were obtained, as compared with the samples 3-9 and 3-10 in which the organic photoelectric conversion layer was formed using the RR-type quinacridone derivative and the HH-type quinacridone derivative. Further, as compared with the samples 3-12 and 3-13 in which the organic photoelectric conversion layer was formed using two kinds of HH-type quinacridone derivatives, there was little difference in EQE, but responsivity was largely improved. Accordingly, it was found that forming the organic photoelectric conversion layer using the HR-type quinacridone derivative and the HH-type quinacridone derivative made external quantum efficiency and responsivity compatible and made it possible to further improve external quantum efficiency.

It is to be noted that the sample 3-4 had less favorable results of EQE and responsivity, as compared with the samples 3-1 to 3-3. The following reason is considered. For example, since EQE and responsivity in the sample 3-10 were deteriorated more than those in the sample 3-9, it is considered that a quinacridone derivative including a phenyl group as a substituent group at an N-position has a tendency that EQE and responsivity are deteriorated, as compared with a quinacridone derivative including a methyl group as the substituent group at the N-position. This tendency was shown between the samples 3-6 and the samples 3-7 using the HR-type quinacridone derivative; therefore, it is considered that deteriorations in EQE and responsivity in the sample 3-4 as compared with the samples 3-1 to 3-3 were caused by the substituent group at the N-position of the quinacridone derivative (a difference between the methyl group and the phenyl group). It is considered that a cause of deteriorations in EQE and responsivity by conversion of the substituent group at the N-position of the quinacridone derivative from the methyl group to the phenyl group was that carrier transport performance and carrier use efficiency were deteriorated by an influence of the substituent group.

It is to be noted that in a case where the sample 3-4 (the HR-type+the HH-type) and the sample 3-7 (the HH-type) both using the MPQD represented by the formula (1-3) are compared with each other, in the sample 3-4, an improvement in EQE was observed without a deterioration in responsivity. Accordingly, it is found that using the HH-type quinacridone derivative together with the HR-type quinacridone derivative makes EQE and responsivity compatible and makes it possible to further improve EQE.

Experiment 4

Next, photoelectric conversion elements (samples 4-1 to 4-9) were fabricated by a method similar to that in the foregoing experiment 1 except for the configuration of the organic photoelectric conversion layer, and external quantum efficiency and responsivity of these samples were evaluated. In the present experiment, a volume ratio of the quinacridone derivative and the subphthalocyanine derivative configuring the organic photoelectric conversion layer was verified.

In the samples 4-1 to 4-5, MMQD represented by the formula (1-1) as the quinacridone derivative and SubPcCl represented by the formula (2-3) as the subphthalocyanine derivative were used. In the samples 4-6 to 4-8, QD represented by the formula (3-1) as the quinacridone derivative and SubPcCl represented by the formula (2-3) as the subphthalocyanine derivative were used. In the sample 4-9, DMQD represented by the formula (4) as the quinacridone derivative and SubPcCl represented by the formula (2-3) as the subphthalocyanine derivative were used. The organic photoelectric conversion layer in each of the samples was formed by appropriately adjusting a ratio of the quinacridone derivative and the subphthalocyanine derivative within a range from 90%:10% to 25%:75% in volume ratio. Table 4 summarizes materials configuring the organic photoelectric conversion layer and volume ratios of the materials, types of quinacridone derivatives used for the organic photoelectric conversion layers, and evaluation results of EQE and responsivity in the samples 4-1 to 4-9. It is to be noted that each of the evaluation results of EQE and responsivity is a relative value with reference to the result in the sample 4-1 as a reference value.

TABLE 4

| | Constituent Material of Photoelectric Conversion Layer Volume Ratio | | Type of QD derivative | EQE | Responsivity |
|---|---|---|---|---|---|
| Sample 4-1 | Formula (1-1) 50% | Formula (2-3) 50% | HR | 1.0 | 1.0 |
| Sample 4-2 | Formula (1-1) 25% | Formula (2-3) 75% | HR | 0.8 | 0.9 |
| Sample 4-3 | Formula (1-1) 75% | Formula (2-3) 25% | HR | 1.2 | 1.3 |
| Sample 4-4 | Formula (1-1) 10% | Formula (2-3) 90% | HR | 0.2 | 10 |
| Sample 4-5 | Formula (1-1) 90% | Formula (2-3) 10% | HR | 0.1 | 50 |
| Sample 4-6 | Formula (3-1) 50% | Formula (2-3) 50% | HH | 2.4 | 10 |
| Sample 4-7 | Formula (3-1) 25% | Formula (2-3) 75% | HH | 1.5 | 90 |
| Sample 4-8 | Formula (3-1) 75% | Formula (2-3) 25% | HH | 2.6 | 18 |
| Sample 4-9 | Formula (4-1) 50% | Formula (2-3) 50% | RR | 0.2 | 4.0 |

As can be seen from Table 4, in a case where the organic photoelectric conversion layer was formed using the HR-type quinacridone derivative and the subphthalocyanine derivative, a ratio of the quinacridone derivative and the subphthalocyanine derivative was within a range from 25%:75% to 75%:25% in volume ratio, which stably made high EQE and superior responsivity compatible. In other words, it was found that adjusting a volume ratio of the HR-type quinacridone derivative included in the organic photoelectric conversion layer within a range from 25% to 75% both inclusive made it possible to achieve high EQE and superior responsivity.

In contrast, in a case where the volume ratio of the HR-type quinacridone derivative was less than 25%, EQE and responsivity were largely deteriorated. It is considered that an area of an interface between the HR-type quinacridone derivative as the organic p-type semiconductor and the subphthalocyanine derivative as the organic n-type semiconductor was reduced, which reduced a possibility that an exciton reached the interface to result in a deterioration in external quantum efficiency. Regarding a deterioration in responsivity, it is considered that in a carrier transport process after excitation dissociation, holes were transported through between the HR-type quinacridone derivatives as the organic p-type semiconductor; therefore, a possibility that the HR-type quinacridone derivatives were adjacent to each other was reduced, and holes were not thereby transported efficiently to increase the falling time, that is, to deteriorate responsivity. Moreover, in a case where the volume ratio of the HR-type quinacridone derivative exceeded 75%, EQE and responsivity were largely deteriorated. It is considered that, as with the case where the volume ratio of the HR-type quinacridone derivative was less than 25%, the area of the interface between the HR-type quinacridone derivative as the organic p-type semiconductor and the subphthalocyanine derivative as the organic n-type semiconductor was reduced, which reduced a possibility that an exciton reached the interface to result in a deterioration in external quantum efficiency. Regarding a deterioration in responsivity, it is considered that in the carrier transport process after exciton dissociation, electrons were transported through between the subphthalocyanine derivatives as the organic n-type semiconductor; therefore, a possibility that the subphthalocyanine derivatives were adjacent to each other was reduced, and electrons were not thereby transported efficiently to increase the falling time, that is, to deteriorate responsivity.

Experiment 5

Next, photoelectric conversion elements (samples 5-1 to 5-14) were fabricated by a method similar to that in the foregoing experiment 1 except for the configuration of the organic photoelectric conversion layer, and external quantum efficiency and responsivity of these samples were evaluated. In the present experiment, two kinds of quinacridone derivatives and a subphthalocyanine derivative configured the organic photoelectric conversion layer, a volume ratio thereof was verified.

As a first type of quinacridone derivative used in the respective samples, BMQD represented by the formula (1-7) was used in the samples 5-1 to 5-8, DMQD represented by the formula (4-1) was used in the samples 5-9 and 5-10, DPQD represented by the formula (4-2) was used in the sample 5-11, BQD represented by the formula (3-4) was used in the sample 5-12, PR122 represented by the formula (3-2) was used in the sample 5-13, and EQD represented by the formula (3-3) was used in the sample 5-14. As a second type of quinacridone derivative, BQD represented by the formula (3-4) was used, and as the subphthalocyanine derivative, $F_6SubPcCl$ represented by the formula (2-1) was used in the samples 3-5. It is to be noted that in each of the samples 5-8, 5-9, and 5-12, the second type of quinacridone derivative was not used to form the organic photoelectric conversion layer. Table 5 summarizes materials configuring the organic photoelectric conversion layer and volume ratios of the materials, types of quinacridone derivatives used for the organic photoelectric conversion layers, and evaluation results of EQE and responsivity in the sample 5-1 to 5-14. It is to be noted that each of the evaluation results of EQE and responsivity is a relative value with reference to the result in the sample 5-1 as a reference value.

As can be seen from Table 5, it was found that in a case where the organic photoelectric conversion layer was formed using two kinds, that is, the HR-type and HH-type quinacridone derivatives, and the subphthalocyanine derivative, forming the organic photoelectric conversion layer by adjusting a volume ratio of the two kinds of quinacridone derivatives within a range from 33% to 67% both inclusive made high EQE and superior responsivity compatible. It is to be noted that in a case where the volume ratio of the two kinds, that is, HR-type and HH-type quinacridone derivatives was within a range from 25% to 75% both inclusive, but the content of the HR-type quinacridone derivative was extremely small as with the sample 5-6, a further improvement in responsivity was not observed, and responsivity was substantially equal to that in a case where only one kind, that is, the HH-type quinacridone derivative was used. Moreover, in a case where the content of the HH-type quinacridone derivative was extremely small as with the sample 5-7, a further improvement in EQE was not observed, and EQE was substantially equal to that in a case where only one kind, that is, the HR-type quinacridone derivative was used. Accordingly, it was found that in a case where the organic photoelectric conversion layer was formed using two kinds, that is, the HR-type and HH-type quinacridone derivatives, the ratio of the HR-type quinacridone derivative was preferably adjusted within a range from 33% to 67% both inclusive in volume ratio.

Although the description has been given by referring to the first and second embodiments and the examples, the contents of the present disclosure are not limited to the foregoing embodiments, etc., and may be modified in a variety of ways. For example, the foregoing embodiments have exemplified, as the photoelectric conversion element (the solid-state imagine device), a configuration in which the organic photoelectric converter 11G detecting green light and the inorganic photoelectric converters 11B and 11R respectively detecting blue light and red light are stacked;

TABLE 5

|  | Configuration of Photoelectric Conversion Layer Volume Ratio | | | Type of QD derivative | EQE | Responsivity |
| --- | --- | --- | --- | --- | --- | --- |
| Sample 5-1 | Formula (1-7) 25% | Formula (3-4) 25% | Formula (2-1) 50% | HR + HH | 1.0 | 1.0 |
| Sample 5-2 | Formula (1-7) 12.5% | Formula (3-4) 12.5% | Formula (2-1) 75% | HR + HH | 0.9 | 0.9 |
| Sample 5-3 | Formula (1-7) 37.5% | Formula (3-4) 37.5% | Formula (2-1) 25% | HR + HH | 1.2 | 1.6 |
| Sample 5-4 | Formula (1-7) 50% | Formula (3-4) 25% | Formula (2-1) 25% | HR + HH | 0.8 | 1.5 |
| Sample 5-5 | Formula (1-7) 25% | Formula (3-4) 50% | Formula (2-1) 25% | HR + HH | 1.0 | 1.7 |
| Sample 5-6 | Formula (1-7) 5% | Formula (3-4) 45% | Formula (2-1) 50% | HR + HH | 0.6 | 9.0 |
| Sample 5-7 | Formula (1-7) 45% | Formula (3-4) 5% | Formula (2-1) 50% | HR + HH | 0.4 | 2.5 |
| Sample 5-8 | Formula (1-7) 50% | — | Formula (2-1) 50% | HR | 0.4 | 2.5 |
| Sample 5-9 | Formula (4-1) 50% | — | Formula (2-1) 50% | RR | 0.4 | 5.0 |
| Sample 5-10 | Formula (4-1) 1 | Formula (3-4) 1 | Formula (2-1) 1 | RR + HH | 0.5 | 7.0 |
| Sample 5-11 | Formula (4-2) 1 | Formula (3-4) 1 | Formula (2-1) 1 | RR + HH | 0.1 | 30 |
| Sample 5-12 | Formula (3-4) 50% | — | Formula. (2-1) 50% | HH | 0.7 | 10 |
| Sample 5-13 | Formula (3-2) 1 | Formula (3-4) 1 | Formula (2-1) 1 | HH + HH | 0.7 | 17 |
| Sample 5-14 | Formula (3-1) 1 | Formula (3-4) 1 | Formula (2-1) 1 | HH + HH | 0.8 | 11 | however, the contents of the present disclosure is not limited thereto. In other words, the organic photoelectric converter may detect red light or blue light, and the inorganic photoelectric converter may detect green light.

Moreover, the number of organic photoelectric converters, the number of inorganic photoelectric converters, a ratio between the organic photoelectric converters and the inorganic photoelectric converters are not limited, and two or more organic photoelectric converters may be provided, or color signals of a plurality of colors may be obtained by only the organic photoelectric converter. Further, the contents of the present disclosure is not limited to a configuration in which organic photoelectric converters and inorganic photoelectric converters are stacked along the vertical direction, and organic photoelectric converters and inorganic photoelectric converters may be disposed side by side along a substrate surface.

Furthermore, the foregoing first and second embodiments have exemplified the configuration of the back-side illumination type solid-state imaging device, however, the contents of the present disclosure are applicable to a front-side illumination type solid-state imaging device. Further, it may not be necessary for the solid-state imaging device (the photoelectric conversion element) of the present disclosure to include all components described in the foregoing embodiments, and the solid-state imaging device of the present disclosure may include any other layer.

It is to be noted that the effects described in the present specification are illustrative and non-limiting, and other effects may be included.

It is to be noted that the present disclosure may have the following configurations.

[1]

A photoelectric conversion element, including:

a first electrode and a second electrode facing each other, and a photoelectric conversion layer provided between the first electrode and the second electrode, and including a first quinacridone derivative represented by the following formula (1),

[Chem. 1]

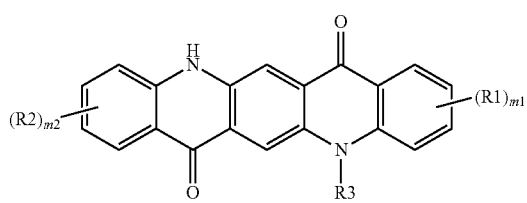

(1)

(where each of R1 and R2 is independently one of an alkyl group, an alkenyl group, an alkynyl group, an aryl group, a cyano group, a nitro group, and a silyl group, each of m1 and m2 is independently 0 or an integer of 1 or more, in a case where each of m1 and m2 is 2 or more, two or more R1 are optionally bound to one another to form a ring and two or more R2 are optionally bound to one another to form a ring, and R3 is one of an alkyl group, an aryl group, and a heterocyclic group.)

[2]

The photoelectric conversion element according to [1], in which the photoelectric conversion layer further includes a subphthalocyanine derivative represented by the following formula (2),

[Chem. 2]

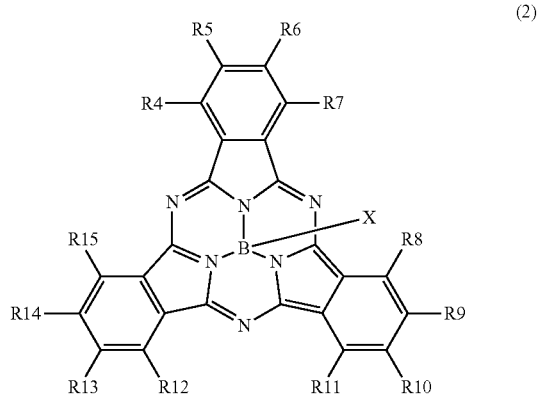

(2)

(where each of R4 to R15 is independently a hydrogen atom, a halogen atom, a straight-chain, branched, or cyclic alkyl group, a thioalkyl group, a thioaryl group, an arylsulfonyl group, an alkylsulfonyl group, an amino group, an alkylamino group, an arylamino group, a hydroxy group, an alkoxy group, an acylamino group, an acyloxy group, a phenyl group, a carboxy group, a carboxyamide group, a carboalkoxy group, an acyl group, a sulfonyl group, a cyano group, and a nitro group, any adjacent ones of R4 to R15 are optionally bound to one another to form a ring, and X is an anionic group.)

[3]

The photoelectric conversion element according to [1] or [2], in which a content of the first quinacridone derivative included in the photoelectric conversion layer is within a range from 25% to 75% both inclusive in volume ratio.

[4]

The photoelectric conversion element according to [2] or [3], in which the photoelectric conversion layer includes a second quinacridone derivative represented by the following formula (3) in addition to the first quinacridone derivative and the subphthalocyanine derivative,

[Chem. 3]

(3)

(where each of R16 and R17 is independently one of an alkyl group, an alkenyl group, an alkynyl group, an aryl group, a cyano group, a nitro group, and a silyl group, each of n1 and n2 is independently 0 or an integer of 1 or more, and in a case where each of n1 and n2 is 2 or more, two or more R16 are optionally bound to one another to form a ring and two or more R17 are optionally bound to one another to form a ring.)

[5]

The photoelectric conversion element according to [4], in which a total content of the first quinacridone derivative and the second quinacridone derivative included in the photoelectric conversion layer is within a range from 25% to 75% both inclusive in volume ratio.

[6]

The photoelectric conversion element according to [4] or [5], in which a content of the first quinacridone derivative in the photoelectric conversion layer including the first quinacridone derivative and the second quinacridone derivative is within a range from 33% to 67% both inclusive in volume ratio.

[7]

A solid-state imaging device provided with pixels each including one or a plurality of organic photoelectric converters, each of the organic photoelectric converters including:

a first electrode and a second electrode facing each other, and a photoelectric conversion layer provided between the first electrode and the second electrode, and including a first quinacridone derivative represented by the following formula (1),

[Chem. 4]

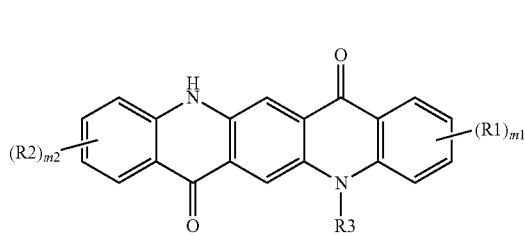

(1)

(where each of R1 and R2 is independently one of an alkyl group, an alkenyl group, an alkynyl group, an aryl group, a cyano group, a nitro group, and a silyl group, each of m1 and m2 is independently 0 or an integer of 1 or more, in a case where each of m1 and m2 is 2 or more, two or more R1 are optionally bound to one another to form a ring and two or more R2 are optionally bound to one another to form a ring, and R3 is one of an alkyl group, an aryl group, and a heterocyclic group.)

[8]

The solid-state imaging device according to [7], in which the one or plurality of organic photoelectric converters, and one or a plurality of inorganic photoelectric converters that performs photoelectric conversion in a wavelength region different from a wavelength region of the organic photoelectric converters are stacked in each of the pixels.

[9]

The solid-state imaging device according to [8], in which the inorganic photoelectric converter is formed to be embedded in a semiconductor substrate, and the organic photoelectric converter is formed on a first surface side of the semiconductor substrate.

[10]

The solid-state imaging device according to any one of [7] to [9], in which the organic photoelectric converter performs photoelectric conversion on green light, and an inorganic photoelectric converter that performs photoelectric conversion on blue light and an inorganic photoelectric converter that performs photoelectric conversion on red light are stacked in the semiconductor substrate.

This application claims the benefit of Japanese Priority Patent Application JP2015-215966 filed on Nov. 2, 2015, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A photoelectric conversion element, comprising:

a first electrode and a second electrode facing each other; and a photoelectric conversion layer provided between the first electrode and the second electrode, and comprising a subphthalocyanine derivative, a first quinacridone derivative, and a second quinacridone derivative, wherein an amount, based on volume, of the first quinacridone derivative and the second quinacridone derivative is greater than an amount, based on volume, of the subphthalocyanine derivative, wherein the first quinacridone derivative is represented by formula (1),

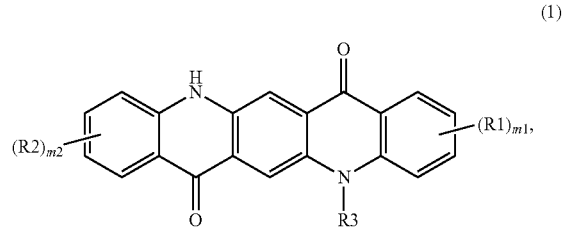

(1)

where each of R1 and R2 is independently one of an alkyl group, an alkenyl group, an alkynyl group, an aryl group, a cyano group, a nitro group, and a silyl group, each of m1 and m2 is independently 0 or an integer of 1 or more, in a case where each of m1 and m2 is 2 or more, two or more R1 are optionally bound to one another to form a ring and two or more R2 are optionally bound to one another to form a ring, and R3 is one of an alkyl group, an aryl group, and a heterocyclic group, wherein the second quinacridone derivative is represented by formula (3),

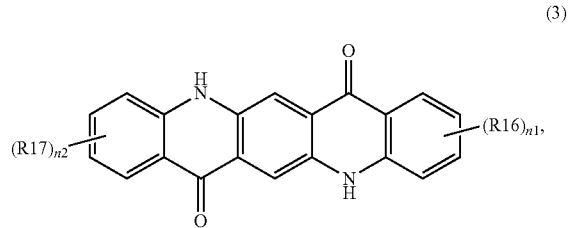

(3)

wherein each of R16 and R17 is independently one of an alkyl group, an alkenyl group, an alkynyl group, an aryl group, a cyano group, a nitro group, and a silyl group, each of n1 and n2 is independently 0 or an integer of 1 or more, and in a case where each of n1 and n2 is 2 or more, two or more R16 are optionally bound to one another to form a ring and two or more R17 are optionally bound to one another to form a ring.

2. The photoelectric conversion element according to claim 1, wherein the subphthalocyanine derivative is represented by formula (2),

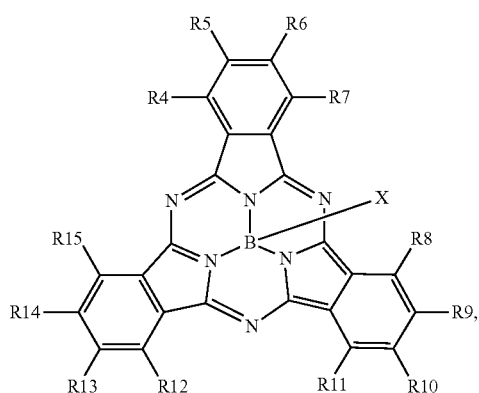

(2)

where each of R4 to R15 is independently a hydrogen atom, a halogen atom, a straight-chain, branched, or cyclic alkyl group, a thioalkyl group, a thioaryl group, an arylsulfonyl group, an alkylsulfonyl group, an amino group, an alkylamino group, an arylamino group, a hydroxy group, an alkoxy group, an acylamino group, an acyloxy group, a phenyl group, a carboxy group, a carboxyamide group, a carboalkoxy group, an acyl group, a sulfonyl group, a cyano group, and a nitro group, any adjacent ones of R4 to R15 are optionally bound to one another to form a ring, and X is an anionic group.

3. The photoelectric conversion element according to claim 1, wherein a ratio of the first quinacridone derivative to the second quinacridone derivative is from 33:67 to 67:33 based on volume.

4. A solid-state imaging device provided with pixels each including one or a plurality of organic photoelectric converters, each of the organic photoelectric converters comprising:
a first electrode and a second electrode facing each other; and
a photoelectric conversion layer provided between the first electrode and the second electrode, comprising a subphthalocyanine derivative, a first quinacridone derivative, and a second quinacridone derivative,
wherein an amount, based on volume, of the first quinacridone derivative and the second quinacridone derivative is greater than an amount, based on volume, of the subphthalocyanine derivative,
wherein the first quinacridone derivative is represented by formula (1),

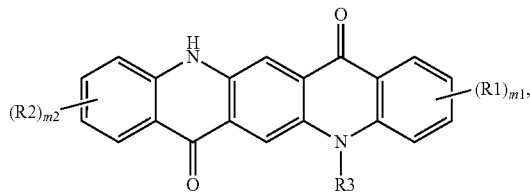

(1)

wherein each of R1 and R2 is independently one of an alkyl group, an alkenyl group, an alkynyl group, an aryl group, a cyano group, a nitro group, and a silyl group, each of m1 and m2 is independently 0 or an integer of 1 or more, in a case where each of m1 and m2 is 2 or more, two or more R1 are optionally bound to one another to form a ring and two or more R2 are optionally bound to one another to form a ring, and R3 is one of an alkyl group, an aryl group, and a heterocyclic group,
wherein the second quinacridone derivative is represented by formula (3),

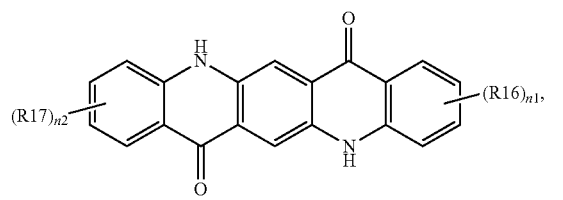

(3)

wherein each of R16 and R17 is independently one of an alkyl group, an alkenyl group, an alkynyl group, an aryl group, a cyano group, a nitro group, and a silyl group, each of n1 and n2 is independently 0 or an integer of 1 or more, and in a case where each of n1 and n2 is 2 or more, two or more R16 are optionally bound to one another to form a ring and two or more R17 are optionally bound to one another to form a ring.

5. The solid-state imaging device according to claim 4, wherein the one or plurality of organic photoelectric converters, and one or a plurality of inorganic photoelectric converters that performs photoelectric conversion in a wavelength region different from a wavelength region of the organic photoelectric converters are stacked in each of the pixels.

6. The solid-state imaging device according to claim 5, wherein
the inorganic photoelectric converter is formed to be embedded in a semiconductor substrate, and
the organic photoelectric converter is formed on a first surface side of the semiconductor substrate.

7. The solid-state imaging device according to 6, wherein
the organic photoelectric converter performs photoelectric conversion on green light, and
an inorganic photoelectric converter that performs photoelectric conversion on blue light and an inorganic photoelectric converter that performs photoelectric conversion on red light are stacked in the semiconductor substrate.

8. The solid-state imaging device according to claim 4, wherein the subphthalocyanine derivative is represented by formula (2),

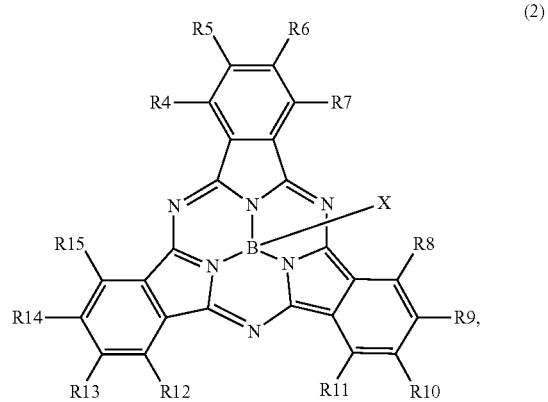

(2)

where each of R4 to R15 is independently a hydrogen atom, a halogen atom, a straight-chain, branched, or cyclic alkyl group, a thioalkyl group, a thioaryl group, an arylsulfonyl group, an alkylsulfonyl group, an amino group, an alkylamino group, an arylamino group, a hydroxy group, an alkoxy group, an acylamino group, an acyloxy group, a phenyl group, a carboxy group, a carboxyamide group, a carboalkoxy group, an acyl group, a sulfonyl group, a cyano group, and a nitro group, any adjacent ones of R4 to R15 are optionally bound to one another to form a ring, and X is an anionic group.

9. The solid-state imaging device according to claim 4, wherein a ratio of the first quinacridone derivative to the second quinacridone derivative is from 33:67 to 67:33 based on volume.

10. The photoelectric conversion element according to claim 1, wherein a responsivity of the photoelectric conversion element is higher than a responsivity of an analogous photoelectric conversion element comprising a photoelectric conversion layer comprising a quinacridone derivative but lacking the first quinacridone derivative represented by formula (1).

11. The photoelectric conversion element according to claim 1, wherein the ratio of the first quinacridone derivative and the second quinacridone derivative to the subphthalocyanine derivative is 25:75 based on volume.

12. A photoelectric conversion element, comprising:
a first electrode and a second electrode facing each other; and
a photoelectric conversion layer provided between the first electrode and the second electrode, consisting of a subphthalocyanine derivative and a quinacridone derivative,
wherein the quinacridone derivative is represented by formula (1),

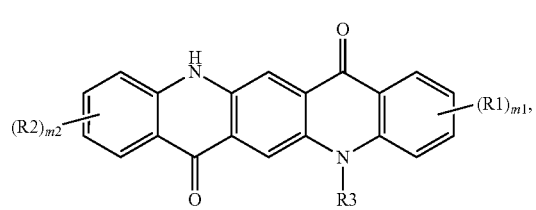

(1)

where each of R1 and R2 is independently one of an alkyl group, an alkenyl group, an alkynyl group, an aryl group, a cyano group, a nitro group, and a silyl group, each of m1 and m2 is independently 0 or an integer of 1 or more, in a case where each of m1 and m2 is 2 or more, two or more R1 are optionally bound to one another to form a ring and two or more R2 are optionally bound to one another to form a ring, and R3 is one of an alkyl group, an aryl group, and a heterocyclic group, and wherein the subphthalocyanine derivative is represented by formula (2),

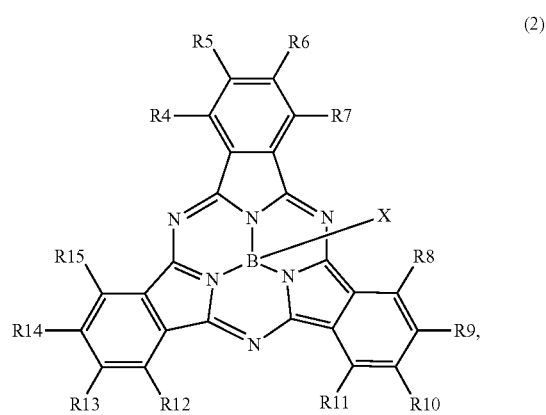

(2)

where each of R4 to R15 is independently a hydrogen atom, a halogen atom, a straight-chain, branched, or cyclic alkyl group, a thioalkyl group, a thioaryl group, an arylsulfonyl group, an alkylsulfonyl group, an amino group, an alkylamino group, an arylamino group, a hydroxy group, an alkoxy group, an acylamino group, an acyloxy group, a phenyl group, a carboxy group, a carboxyamide group, a carboalkoxy group, an acyl group, a sulfonyl group, a cyano group, and a nitro group, any adjacent ones of R4 to R15 are optionally bound to one another to form a ring, and X is an anionic group.

13. The photoelectric conversion element according to claim 12, wherein a ratio of the quinacridone derivative to the subphthalocyanine derivative is from 25:75 to 75:25 based on volume.

* * * * *